(12) United States Patent
Isohata et al.

(10) Patent No.: US 10,326,455 B2
(45) Date of Patent: Jun. 18, 2019

(54) INTEGRATED CIRCUIT DEVICE, ELECTRONIC DEVICE, ELECTRONIC APPARATUS, AND BASE STATION

(71) Applicant: Seiko Epson Corporation, Tokyo (JP)

(72) Inventors: Kensaku Isohata, Minowa-machi (JP); Takayuki Kikuchi, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 161 days.

(21) Appl. No.: 15/337,669

(22) Filed: Oct. 28, 2016

(65) Prior Publication Data

US 2017/0126234 A1    May 4, 2017

(30) Foreign Application Priority Data

Nov. 2, 2015 (JP) ................. 2015-215500

(51) Int. Cl.
*H03B 5/32* (2006.01)
*H03L 1/02* (2006.01)
*H03L 1/04* (2006.01)
*H01L 23/00* (2006.01)
*H01L 23/34* (2006.01)

(52) U.S. Cl.
CPC ............ *H03L 1/04* (2013.01); *H01L 23/34* (2013.01); *H01L 23/345* (2013.01); *H01L 24/09* (2013.01); *H01L 24/48* (2013.01); *H03B 5/32* (2013.01); *H03L 1/028* (2013.01); *H01L 2224/04042* (2013.01); *H01L 2224/48106* (2013.01); *H01L 2224/48227* (2013.01); *H01L 2924/351* (2013.01); *H03B 2200/001* (2013.01); *H03B 2200/0008* (2013.01); *H03B 2200/0012* (2013.01); *H03B 2200/0018* (2013.01)

(58) Field of Classification Search
CPC .. H03H 7/00; H03L 1/04; H03L 1/022; H03L 1/027; H03L 1/028; G01K 7/021; G01K 7/023; G01K 2007/163; H03B 5/32; H01L 23/345; H01L 24/09; H01L 24/48
USPC ............ 331/176, 158, 116 FE, 116 R, 108 C
See application file for complete search history.

(56) References Cited

U.S. PATENT DOCUMENTS

| 9,548,437 | B2 * | 1/2017 | Ohashi | ............... H03H 9/1092 |
| 9,754,803 | B2 * | 9/2017 | Kondo | ............... H01L 21/4842 |
| 2014/0292151 | A1 | 10/2014 | Kondo | |
| 2015/0180444 | A1 | 6/2015 | Hayashi et al. | |
| 2017/0359075 | A1 * | 12/2017 | Kikuchi | ................. H03H 7/00 |

FOREIGN PATENT DOCUMENTS

| JP | 2000-031773 A | 1/2000 |
| JP | 2001-102891 A | 4/2001 |
| JP | 2011-205429 A | 10/2011 |
| JP | 2011-205430 A | 10/2011 |
| JP | 2013-002981 A | 1/2013 |
| JP | 2014-049966 A | 3/2014 |

(Continued)

*Primary Examiner* — Arnold M Kinkead
(74) *Attorney, Agent, or Firm* — Oliff PLC

(57) ABSTRACT

An integrated circuit device includes a substrate, a joining part provided on the substrate and joined to a vibrator, and a plurality of bonding pads provided on the substrate. The joining part includes an insulating protective film that covers a part of a surface of the substrate, and no insulating protective film is provided between the adjacent bonding pads.

10 Claims, 24 Drawing Sheets

(56) References Cited

FOREIGN PATENT DOCUMENTS

| JP | 2014-192674 A | 10/2014 |
| JP | 2014-197732 A | 10/2014 |
| JP | 2015-122426 A | 7/2015 |

* cited by examiner

INTEGRATED CIRCUIT DEVICE, ELECTRONIC DEVICE, ELECTRONIC APPARATUS, AND BASE STATION

CROSS-REFERENCE TO RELATED APPLICATIONS

This application claims priority to Japanese Patent Application No. 2015-215500, filed Nov. 2, 2015, the entirety of which is hereby incorporated by reference.

BACKGROUND

1. Technical Field

The present invention relates to an integrated circuit device, an electronic device, an electronic apparatus, and a base station.

2. Related Art

Stable output frequencies with higher accuracy to temperature changes are required for crystal oscillators used for reference frequency signal sources for communication apparatuses or measuring instruments. Generally, oven controlled crystal oscillators (OCXO) are known as crystal oscillators with extremely high frequency stability.

The OCXO houses a quartz crystal vibrator within a thermostatic oven controlled at a constant temperature. For example, Patent Document 1 (JP-A-2015-122426) discloses an OCXO in which a vibrator element, a heat generation IC, and an oscillation IC are housed within a package.

The heat generation IC of Patent Document 1 includes a semiconductor substrate on which a diffusion layer is formed, a pad for application of a power supply voltage to the diffusion layer, and a pad for application of a ground voltage to the diffusion layer. An insulating layer is formed on the diffusion layer, and a surface protective film is formed on the insulating layer. Opening portions are formed in the surface protective film and the rectangular pads are formed on the surface of the insulating layer in the opening portions.

However, in the heat generation IC of Patent Document 1, the opening portions are formed in the surface protective film and the pads are formed within the opening portions, and steps are formed by the surface protective film and the pads. The steps may hinder wire bonding to the pads. For example, when the positions of the opening portions shift due to manufacturing errors or the like, the capillary used for wire bonding may collide with the steps formed by the surface protective film and the pads.

SUMMARY

An advantage of some aspects of the invention is to provide an integrated circuit device that may improve productivity of wire bonding. Another advantage of some aspects of the invention is to provide an electronic device including the integrated circuit device. Still another advantage of some aspects of the invention is to provide an electronic apparatus and a base station including the integrated circuit device or the electronic device.

The aspects of the invention can be implemented as the following embodiments or application examples.

APPLICATION EXAMPLE 1

An integrated circuit device according to this application example includes a substrate, a joining part provided on the substrate and joined to a vibrator, and a plurality of bonding pads provided on the substrate, wherein an insulating protective film covering a part of a surface of the substrate is provided in the joining part, and no insulating protective film is provided between the adjacent bonding pads.

In the integrated circuit device, no insulating protective film is provided between the adjacent bonding pads, and the insulating protective film and the bonding pads form no steps between the adjacent bonding pads. Thereby, according to the integrated circuit device, the problem that the capillary used for wire bonding collides with the steps formed by the insulating protective film and the bonding pads may be avoided and productivity of wire bonding may be improved.

Note that, in the description according to the invention, the term "on" used, for example, when "a specific object (hereinafter, referred to "A") is formed "on" another specific object (hereinafter, referred to "B") includes the case where A is formed directly on B and the case where A is formed via another object on B.

APPLICATION EXAMPLE 2

The integrated circuit device according to the application example may further include a heat generator that generates heat, and a temperature detector that detects an ambient temperature.

In the integrated circuit device, the heat generator and the temperature detector may be provided close to the vibrator, and thereby, the vibrator may be efficiently heated and the temperature of the vibrator may be accurately detected.

APPLICATION EXAMPLE 3

An electronic device according to this application example includes any one of the integrated circuit devices and the vibrator.

In the electronic device, the integrated circuit device that may improve productivity of wire bonding is provided, and productivity of the electronic device may be improved.

APPLICATION EXAMPLE 4

The electronic device according to the application example may further include a plurality of bump members provided in the joining part, and a conductive joining material at least partially surrounded by the plurality of bump members and joining the vibrator and the joining part.

In the electronic device, at least a part of the conductive joining material is surrounded by the plurality of bump members, and thereby, spread of the conductive joining material when the vibrator is joined to the joining part may be reduced.

APPLICATION EXAMPLE 5

In the electronic device according to the application example, the plurality of bump members may be provided separately from each other.

In the electronic device, when the vibrator is joined to the joining part, the spread of the conductive joining material may be reduced and the excess conductive joining material may be allowed to escape from the region surrounded by the plurality of bump members.

APPLICATION EXAMPLE 6

In the electronic device according to the application example, the plurality of bump members may be arranged in an arc form.

In the electronic device, the spread of the conductive joining material when the vibrator is joined to the joining part may be reduced.

APPLICATION EXAMPLE 7

In the electronic device according to the application example, the joining part may include a conducting pattern electrically connected to the vibrator, and the conducting pattern may include a joining electrode having an oval shape and joined to the vibrator, and a lead electrode electrically connected to at least part of the plurality of bonding pads.

In the electronic device, the joining electrode is configured in the oval shape, i.e. by a curve without a corner portion, and thus, the conductive joining material maybe spread over the enter surface of the joining electrode compared to the case where the joining electrode has a corner portion. Accordingly, in the electronic device, the spread of the conductive joining material when the vibrator is joined to the joining part may be reduced and the joining strength between the vibrator and the joining part may be efficiently improved.

APPLICATION EXAMPLE 8

In the electronic device according to the application example, an oscillation circuit for vibrating the vibrator may be provided.

In the electronic device, an oscillator with higher productivity may be realized.

APPLICATION EXAMPLE 9

An electronic apparatus according to this application example includes any one of the integrated circuit devices or any one of the electronic devices.

In the electronic apparatus, the integrated circuit device that may improve productivity of wire bonding or the electronic device including the integrated circuit device is provided, and thereby, the electronic apparatus with higher productivity may be realized.

APPLICATION EXAMPLE 10

A base station according to this application example includes any one of the integrated circuit devices or any one of the electronic devices.

In the base station, the integrated circuit device that may improve productivity of wire bonding or the electronic device including the integrated circuit device is provided, and thereby, the base station with higher productivity may be realized.

BRIEF DESCRIPTION OF THE DRAWINGS

The embodiments of the invention will be described with reference to the accompanying drawings, wherein like numbers reference like elements.

DESCRIPTION OF EXEMPLARY EMBODIMENTS

As below, embodiments of the invention will be explained in detail using the drawings. The embodiments to be explained do not unduly limit the invention described in the appended claims, and not all of the configurations to be explained are essential component elements of the invention.

As below, as an electronic device according to the invention, an oven controlled crystal oscillator (OCXO) will be explained as an example, however, the electronic device according to the invention may be another kind of device including an integrated circuit device and a vibrator (for example, another oscillator than the OCXO, a sensor, or the like).

1. First Embodiment 1.1. Function of Oven Controlled Crystal Oscillator

Figure 1:
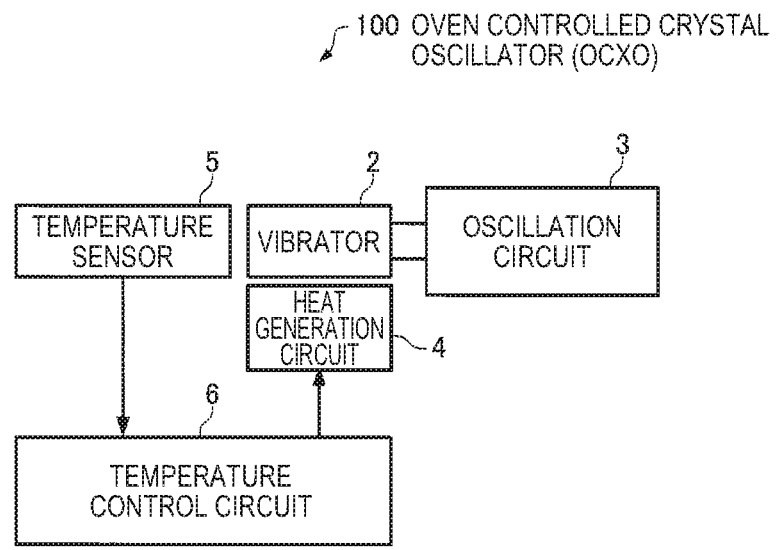
FIG. 1 is a functional block diagram of an oven controlled crystal oscillator according to the first embodiment.

FIG. 1 is a functional block diagram of an oven controlled crystal oscillator (OCXO) 100 according to the first embodiment as an example of the electronic device according to the invention.

As shown in FIG. 1, the oven controlled crystal oscillator 100 includes a vibrator 2, an oscillation circuit 3, a heat generation circuit 4, a temperature sensor 5, and a temperature control circuit 6. Note that, in the oven controlled crystal oscillator 100 according to the embodiment, part of these elements may be omitted or changed or another element may be added.

The vibrator 2 is a quartz crystal vibrator using quartz crystal as a substrate material and, for example, AT cut or SC cut quartz crystal vibrator is used. Note that the vibrator 2 maybe a SAW (Surface Acoustic Wave) resonator or an MEMS (Micro Electro Mechanical Systems) vibrator. Further, as the substrate material of the vibrator 2, not only the quartz crystal but also a piezoelectric material including piezoelectric single crystal of lithium tantalate, lithium niobate, or the like or piezoelectric ceramics such as lead zirconate titanate, a silicon semiconductor material, or the like may be used. As exciting means for the vibrator 2, means by the piezoelectric effect may be used or electrostatic drive by Coulomb force may be performed. As the vibrator 2, a device that detects a physical quantity including e.g. an inertial sensor (acceleration sensor, gyro sensor, or the like) or a force sensor (inclinometer or the like) may be used.

The oscillation circuit 3 is a circuit connected to both ends of the vibrator 2 for oscillating the vibrator 2 by amplifying a signal output from the vibrator 2 and feeding back the signal to the vibrator 2.

The circuit formed by the vibrator 2 and the oscillation circuit 3 may be various oscillation circuits including a pierce oscillation circuit, an inverter oscillation circuit, a colpitts oscillation circuit, and a Hartley oscillation circuit.

The heat generation circuit 4 is a circuit that generates heat when a current flows through a resistance. In the embodiment, the heat generation circuit 4 is provided close to the vibrator 2 for heating the vibrator 2.

The temperature sensor 5 is provided near the vibrator 2 and outputs a signal according to a temperature (for example, a signal having a voltage according to the temperature).

The temperature control circuit 6 is a circuit that controls the amount of current flowing in the resistance of the heat generation circuit 4 based on the output signal (temperature information) of the temperature sensor 5 for keeping the vibrator 2 at a constant temperature. For example, the temperature control circuit 6 flows a desired current in the resistance of the heat generation circuit 4 if a present temperature determined from the output signal of the temperature sensor 5 is lower than a set reference temperature, and controls not to flow a current in the resistance of the heat generation circuit 4 if the present temperature is higher than the reference temperature. Further, for example, the temperature control circuit 6 may control to increase and decrease the amount of current flowing in the resistance of the heat generation circuit 4 according to a difference between the present temperature and the reference temperature.

1.2. Structure of Oven Controlled Crystal Oscillator

Figure 2:
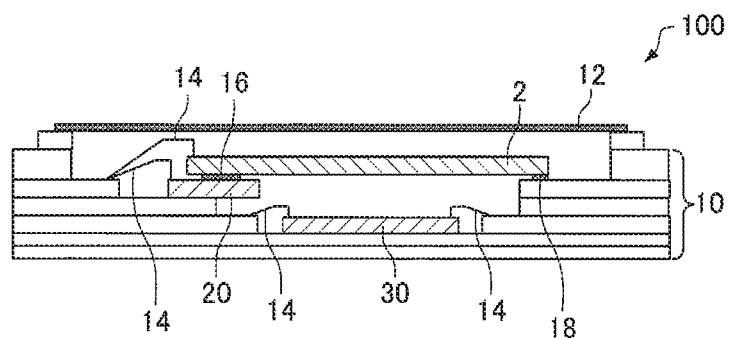
FIG. 2 is a sectional view schematically showing the oven controlled crystal oscillator according to the first embodiment.
Figure 3:
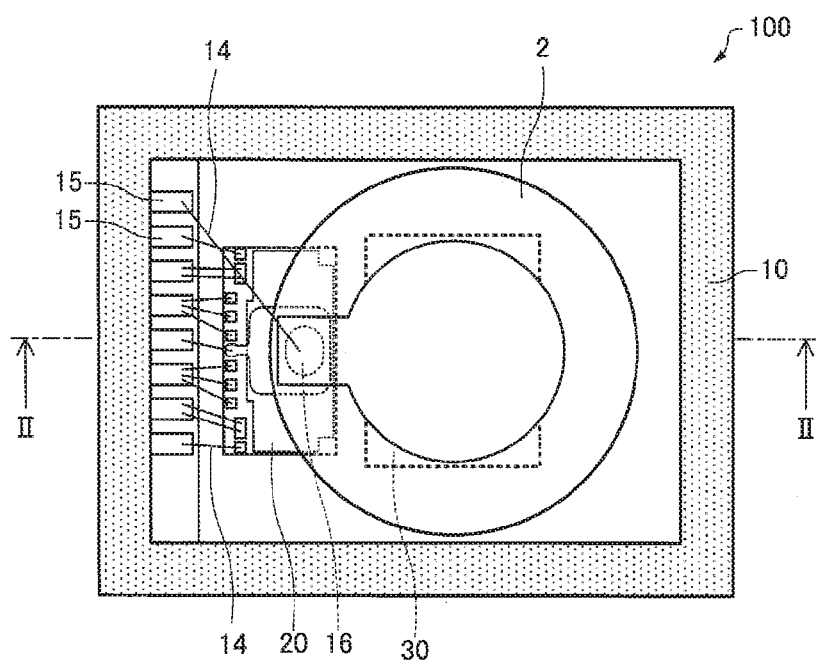
FIG. 3 is a plan view schematically showing the oven controlled crystal oscillator according to the first embodiment.

FIG. 2 is a sectional view schematically showing the oven controlled crystal oscillator 100 according to the first embodiment. FIG. 3 is a plan view schematically showing the oven controlled crystal oscillator 100 according to the first embodiment. FIG. 2 is the sectional view along line II-II in FIG. 3.

As shown in FIG. 1, the oven controlled crystal oscillator 100 includes an integrated circuit device according to the invention. Here, the case where the oven controlled crystal oscillator 100 includes an integrated circuit device 20 as the integrated circuit device according to the invention is explained.

As shown in FIGS. 2 and 3, the oven controlled crystal oscillator 100 includes the vibrator 2, a package 10, a lid 12, the integrated circuit device 20, and an oscillation IC 30. Note that, in FIG. 3, for convenience, the lid 12 is not shown.

The package 10 is a stacked package, e.g. a ceramic package or the like for housing the vibrator 2, the integrated circuit device 20, and the oscillation IC 30 within the same space. In the example shown in FIGS. 2 and 3, an opening portion is provided in the upper part of the package 10 and the opening is covered by the lid 12, and thereby, a housing chamber is formed and the vibrator 2, the integrated circuit device 20, and the oscillation IC 30 are housed in the housing chamber.

The integrated circuit device 20 has the lower surface partially bonded and fixed to the upper surface of the fourth layer from the bottom of the package 10. Bonding pads (bonding pads 24a to 24k, see FIG. 6) provided on the upper surface of the integrated circuit device 20 are bonded to electrodes 15 provided on the upper surface of the fifth layer from the bottom of the package 10 by wires 14. In the embodiment, the integrated circuit device 20 includes the heat generation circuit 4 and the temperature sensor 5 shown in FIG. 1.

The details of the integrated circuit device 20 will be explained in "1.3. Integrated Circuit Device".

The oscillation IC 30 has the lower surface bonded and fixed to the upper surface of the second layer from the bottom of the package 10. The respective electrodes (pads) provided on the upper surface of the oscillation IC 30 are bonded to the respective electrodes provided on the upper surface of the third layer from the bottom of the package 10 by the wires 14. In the embodiment, the oscillation IC 30 includes the oscillation circuit 3 and the temperature control circuit 6 shown in FIG. 1.

The vibrator 2 is fixed to the integrated circuit device 20. In the illustrated example, the electrodes provided in a part on the lower surface side of the vibrator 2 are bonded and fixed to the electrodes (pads) provided on the upper surface of the integrated circuit device 20 by a conductive joining material 16. The conductive joining material 16 is a conductive adhesive agent such as silver paste, for example. The electrodes (pads) provided on the upper surface side of the vibrator 2 are bonded to the electrodes provided on the upper surface of the fifth layer from the bottom of the package 10 by the wires 14.

The vibrator 2 is not only fixed to the integrated circuit device 20, but may be supported by a base portion 18 provided on the upper surface of the package 10. Note that, when the vibrator 2 is fixed to the integrated circuit device 20, the base portion 18 may be used as a spacer for stabilizing the attitude of the vibrator 2. The vibrator 2 and the base portion 18 may be in contact or not. The base portion 18 is e.g. a gold bump.

Note that the vibrator 2 may be housed in a vibrator package (not shown) for housing the vibrator 2 and fixed to the integrated circuit device 20.

Further, inside or on the surface of the package 10, the electrodes wire-bonded to the upper-surface electrodes of the vibrator 2 and the respective electrodes wire-bonded to the respective electrodes of the integrated circuit device 20 are provided. Furthermore, inside or on the surface of the package 10, wiring (not shown) for electrically connecting the respective electrodes of the oscillation IC 30 and the wire-bonded respective electrodes is provided.

In addition, on the lower surface of the package 10, power supply terminals, ground terminals, and other external terminals (output terminals of oscillation signals etc.) are provided (not shown). Further, inside or on the surface of the package 10, wiring for electrically connecting the power supply terminals and the ground terminals to the integrated circuit device 20 and the oscillation IC 30 and wiring for electrically connecting the other external terminals to the oscillation IC 30 are provided.

1.3. Integrated Circuit Device

Figure 4:
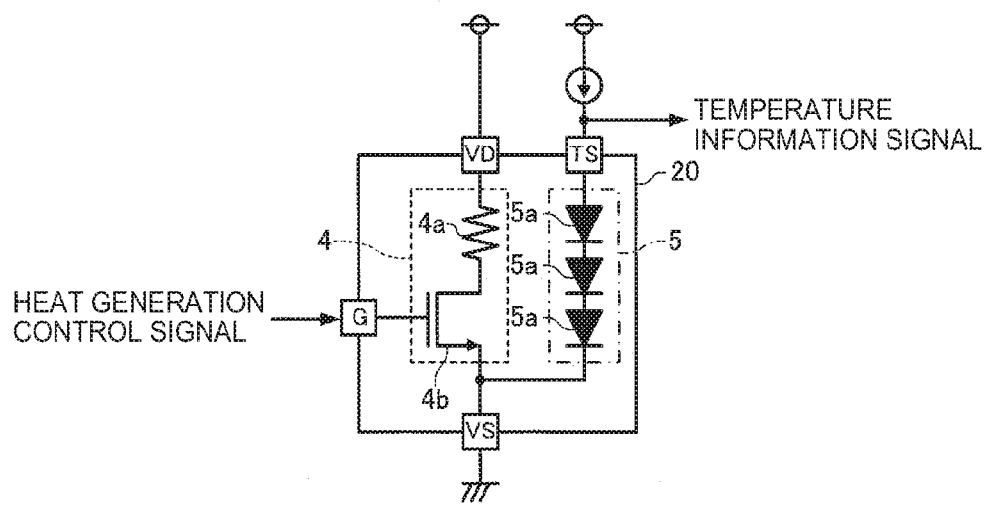
FIG. 4 shows an example of a circuit configuration of an integrated circuit device.

FIG. 4 shows an example of a circuit configuration of the integrated circuit device 20 of the oven controlled crystal oscillator 100 according to the first embodiment.

As shown in FIG. 4, the integrated circuit device 20 has a power supply terminal VD, a ground terminal VS, an input terminal G for heat generation control signal, and an output terminal TS for temperature information signal, and includes the heat generation circuit 4 (an example of a heat generator) and the temperature sensor 5 (an example of a temperature detector).

The heat generation circuit 4 may generate heart. The heat generation circuit 4 functions as a heat generator that generates heat for keeping the temperature of the vibrator 2 constant. The heat generation circuit 4 is formed by series connection of a resistance 4a and a MOS transistor 4b between the power supply terminal VD and the ground terminal VS, and the heat generation control signal output by the temperature control circuit 6 shown in FIG. 1 is input to the gate of the MOS transistor 4b via the input terminal G. The current flowing in the resistance 4a is controlled by the heat generation control signal, and thereby, the amount of generated heat by the resistance 4a is controlled.

The temperature sensor 5 functions as a temperature detector that detects the ambient temperature of the temperature sensor 5. The temperature sensor 5 is formed by series connection of one or more diodes 5a in the forward direction between the output terminal TS and the ground terminal VS. A constant current is supplied to the output terminal TS by the constant current source provided in a temperature control circuit 6 shown in FIG. 1, and thereby, a constant forward current flows in the diode 5a. When the constant forward current is flowed in the diode 5a, a voltage between both ends of the diode 5a nearly linearly changes with temperature changes (for example, changes at a rate of about −6 mV/° C.), and the voltage of the output terminal TS is a linear voltage with respect to the temperature. Therefore, the signal output from the output terminal TS may be used as a temperature information signal.

Figure 5:
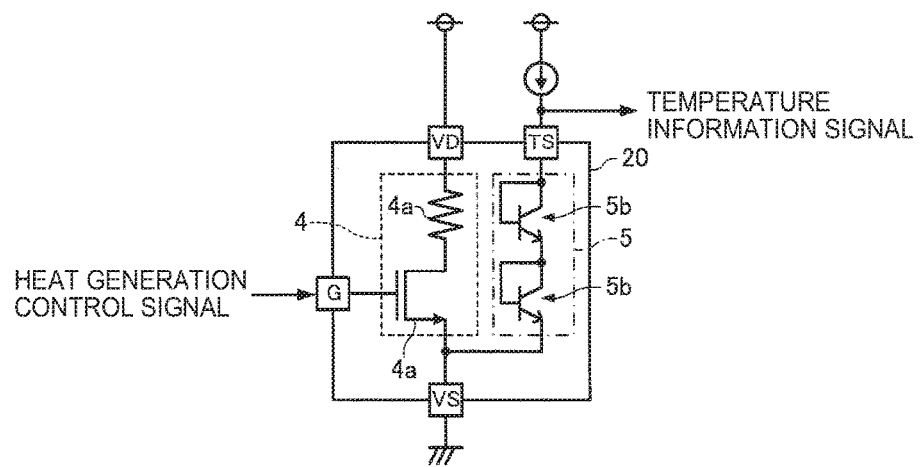
FIG. 5 shows another example of the circuit configuration of the integrated circuit device.

Further, FIG. 5 shows another example of the circuit configuration of the integrated circuit device 20. In FIG. 5, compared to the circuit shown in FIG. 4, in place of the diodes 5a, one or more bipolar transistors 5b are series-connected between the output terminal TS and the ground terminal VS. A base and a collector are connected to each bipolar transistor 5b and, when a constant forward current is flowed between the collector and the emitter of the bipolar transistor 5b, a voltage between the base and the emitter nearly linearly changes with temperature changes. Accordingly, the voltage of the output terminal TS is a linear voltage with respect to the temperature. Therefore, the signal output from the output terminal TS may be used as the temperature information signal.

Figure 6:
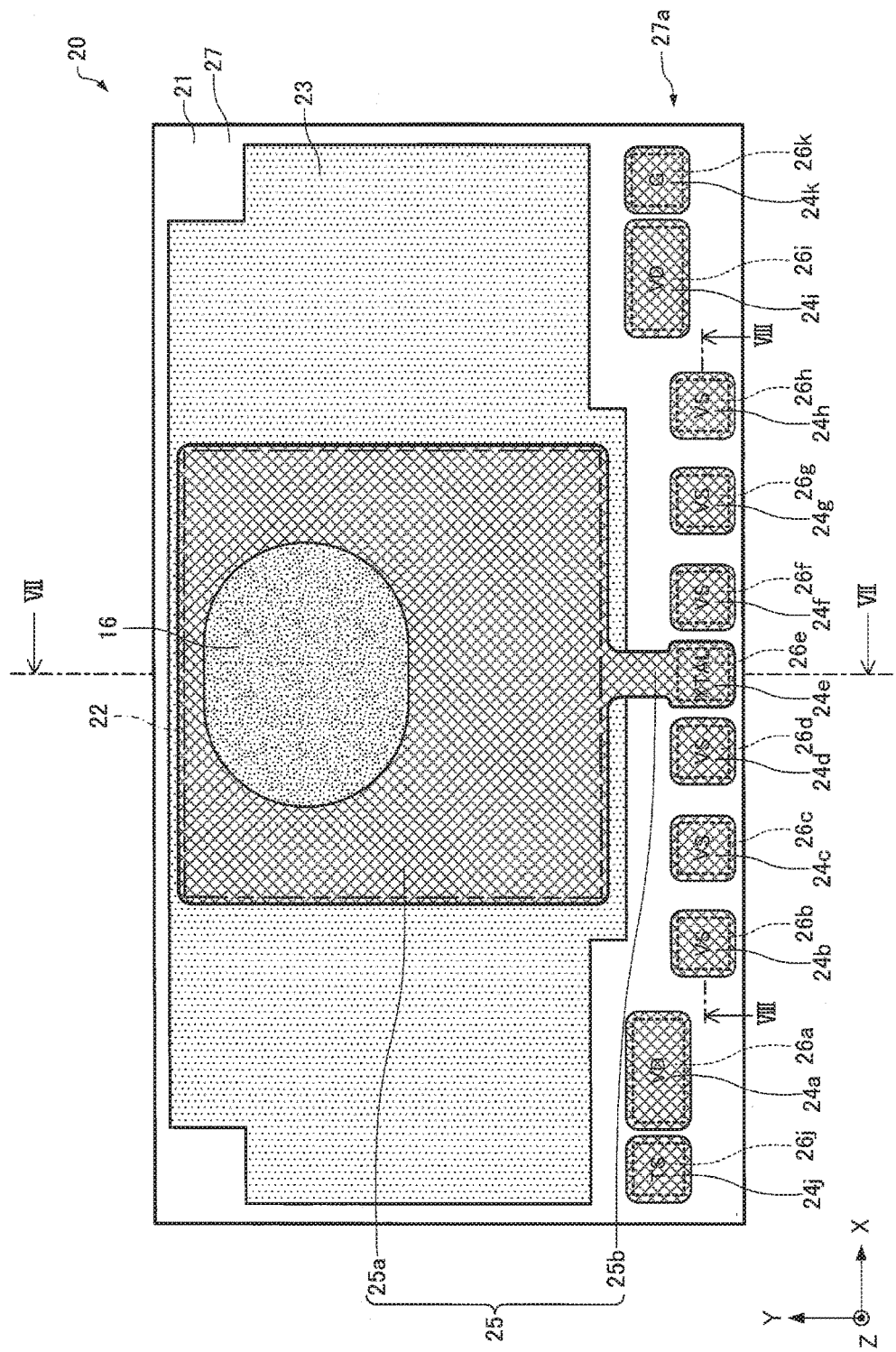
FIG. 6 is a plan view schematically showing the integrated circuit device.
Figure 7:
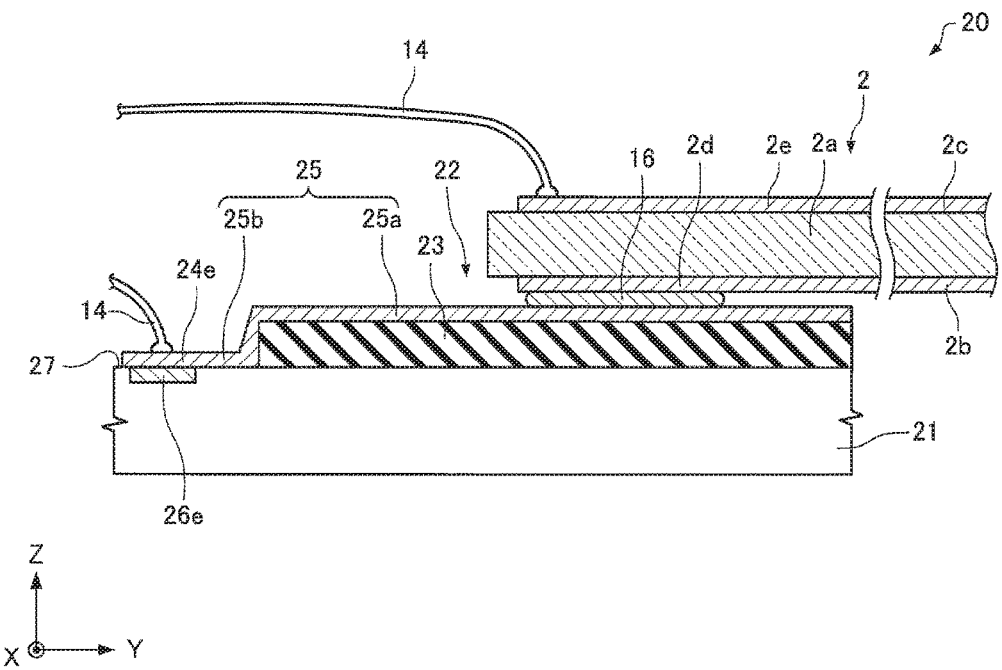
FIG. 7 is a sectional view schematically showing the integrated circuit device.
Figure 8:
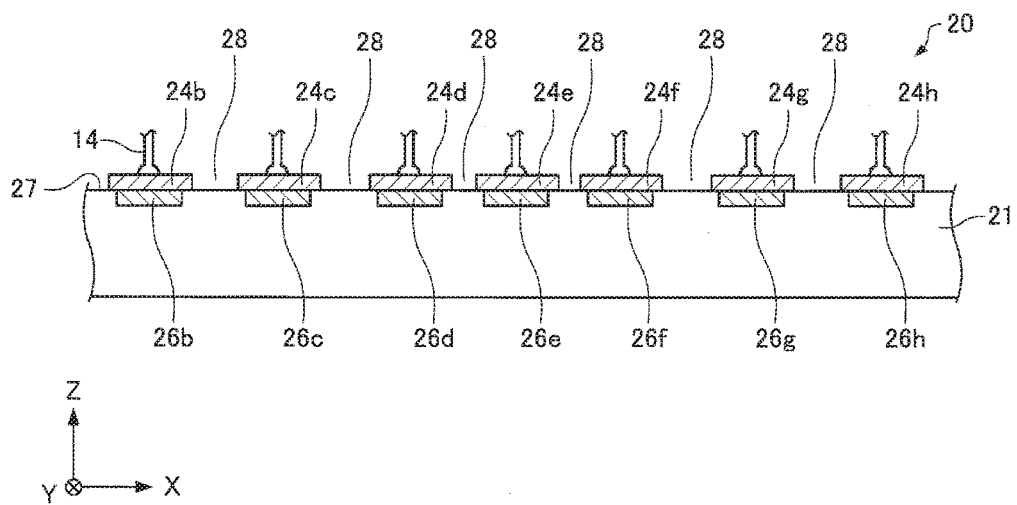
FIG. 8 is a sectional view schematically showing the integrated circuit device.

FIG. 6 is a plan view schematically showing the integrated circuit device 20. FIG. 7 is a sectional view schematically showing the integrated circuit device 20 along line VII-VII in FIG. 6. FIG. 8 is a sectional view schematically showing the integrated circuit device 20 along line VIII-VIII in FIG. 6. Note that, in FIGS. 6 to 8, an X-axis, a Y-axis, and a Z-axis are shown as three axes orthogonal to one another. Further, FIG. 7 shows a state in which the vibrator 2 is fixed to the integrated circuit device 20.

As shown in FIGS. 6 to 8, the integrated circuit device 20 includes an integrated circuit substrate (an example of a substrate) 21, a joining part 22, and bonding pads 24a to 24k.

On the integrated circuit substrate 21, the above described heat generation circuit 4 and temperature sensor 5 shown in FIG. 4 are formed. That is, on the integrated circuit substrate 21, the resistance 4a, the MOS transistor 4b, the diodes 5a, etc. are formed. The details of the integrated circuit substrate 21 will be described later.

The joining part 22 is a part to which the vibrator 2 is joined. The joining part 22 is provided on the integrated circuit substrate 21. The shape and size of the joining part 22 are not particularly limited as long as the vibrator 2 can be fixed thereto.

The joining part 22 includes an insulating protective film 23 and a conducting pattern 25. The insulating protective film 23 is formed on the integrated circuit substrate 21. The insulating protective film 23 covers a part of the surface of the integrated circuit substrate 21 (in the illustrated example, a part of an upper surface 27 of the integrated circuit substrate 21). The insulating protective film 23 functions as a protective film for protecting the surface of the integrated circuit substrate 21. The material of the insulating protective film 23 is e.g. silicon dioxide ($SiO_2$), polyimide, or the like.

The conducting pattern 25 is formed on the insulating protective film 23 and the integrated circuit substrate 21. The conducting pattern 25 is a rewiring layer that electrically connects the bonding pad 24e and a lead electrode 2d of the vibrator 2. The material of the conducting pattern 25 is e.g. copper, an alloy principally consisting of copper, or the like. Note that the conducting pattern 25 may have a surface covered by e.g. gold, aluminum, or an alloy principally consisting of them in order to properly keep connectivity to the conductive joining material 16.

The conducting pattern 25 has a joining electrode 25a joined to the vibrator 2, and a lead electrode 25b that connects the joining electrode 25a and the bonding pad 24e. Note that the lead electrode 25b may be electrically connected to part of the plurality of bonding pads provided on the integrated circuit substrate 21 or electrically connected to all of the plurality of bonding pads.

The joining part 22 is a part in which the insulating protective film 23 and the conducting pattern 25 overlap in a plan view (as seen from a direction of a perpendicular line of the upper surface 27 of the integrated circuit substrate 21, as seen from the Z-axis direction).

As shown in FIG. 7, the vibrator 2 includes a vibrator element 2a using quartz crystal as a substrate material, a lower surface electrode 2b provided on the lower surface of the vibrator element 2a, an upper surface electrode 2c provided on the upper surface of the vibrator element 2a, the lead electrode 2d electrically connected to the lower surface electrode 2b, and a lead electrode 2e electrically connected to the upper surface electrode 2c.

In the oven controlled crystal oscillator 100, the lead electrode 2d of the vibrator 2 and the conducting pattern 25 are electrically and physically connected by the conductive joining material 16. Further, the lead electrode 2e of the vibrator 2 is electrically connected to the electrodes 15 formed in the package 10 by the wire 14.

The bonding pads 24a to 24k are provided on the integrated circuit substrate 21. As shown in FIG. 6, the bonding pads 24a to 24k are arranged along the outer edge of the integrated circuit substrate 21 in the plan view. In the illustrated example, the outer edge of the integrated circuit substrate 21 has a rectangular shape in the plan view, and the bonding pads 24a to 24k are arranged along one side of the rectangle. The bonding pads 24a to 24k are respectively connected to the electrodes 15 formed in the package 10 by the wires 14.

The bonding pad 24a functions as the power supply terminal VD shown in FIG. 4. The bonding pad 24a is provided on an electrode 26a of the integrated circuit substrate 21. The bonding pad 24a is electrically connected to the electrode 26a. Similarly, the bonding pad 24i functions as the power supply terminal VD shown in FIG. 4. The bonding pad 24i is provided on an electrode 26i of the integrated circuit substrate 21. The bonding pad 24i is electrically connected to the electrode 26i.

The bonding pad 24b functions as the ground terminal VS shown in FIG. 4. The bonding pad 24b is provided on an electrode 26b of the integrated circuit substrate 21. The bonding pad 24b is electrically connected to the electrode 26b. Similarly, the bonding pads 24c, 24d, 24f, 24g, 24h respectively function as the ground terminals VS shown in FIG. 4. The bonding pads 24c, 24d, 24f, 24g, 24h are provided on electrodes 26c, 26d, 26f, 26g, 26h of the integrated circuit substrate 21. The bonding pads 24c, 24d, 24f, 24g, 24h are electrically connected to the electrodes 26c, 26d, 26f, 26g, 26h, respectively.

The bonding pad 24j functions as the output terminal TS shown in FIG. 4. The bonding pad 24j is provided on an electrode 26j of the integrated circuit substrate 21. The bonding pad 24j is electrically connected to the electrode 26j.

The bonding pad 24k functions as the input terminal G shown in FIG. 4. The bonding pad 24k is provided on an electrode 26k of the integrated circuit substrate 21. The bonding pad 24k is electrically connected to the electrode 26k.

The bonding pad 24e is provided on an electrode 26e of the integrated circuit substrate 21. The bonding pad 24e is electrically connected to the electrode 26e. The bonding pad 24e is electrically connected to the lower surface electrode 2b of the vibrator 2 via the conducting pattern 25.

The material of the bonding pads 24a to 24k is e.g. copper, an alloy principally consisting of copper, or the like. Further, the bonding pads 24a to 24k may have surfaces covered by e.g. gold, aluminum, or an alloy principally consisting of them in order to properly keep connectivity to the wires 14.

As shown in FIGS. 6 to 8, no insulating protective film (e.g. insulating protective film 23) is provided between the adjacent bonding pads 24a to 24k. Note that the insulating protective film is an insulating film for protecting the surface of the integrated circuit substrate 21. Further, the adjacent bonding pads refer to arbitrary one bonding pad of the plurality of bonding pads and another bonding pad closest to the one bonding pad. For example, the bonding pad 24a and the bonding pad 24j closest to the bonding pad 24a are the adjacent bonding pads.

As shown in FIG. 8, no insulating protective film is provided between the adjacent bonding pads 24a to 24k, but air gaps 28 are provided.

The bonding pads 24a to 24k are arranged along the outer edge of the integrated circuit substrate 21 in the plan view, and no insulating protective film is provided in a region 27a (also referred to as "pad region") along the outer edge on the upper surface 27 of the integrated circuit substrate 21. In other words, the bonding pads 24a to 24k are arranged in the pad region 27a without the insulating protective film on the integrated circuit substrate 21. In the illustrated example, the pad region 27a is a region opposite to the vibration region side of the vibrator 2 (the side in the −Y direction) with respect to the joining electrode 25a of the regions on the upper surface of the integrated circuit substrate 21. Note that the vibration region of the vibrator 2 is a part between the lower surface electrode 2b and the upper surface electrode 2c of the vibrator element 2a.

Figure 9:
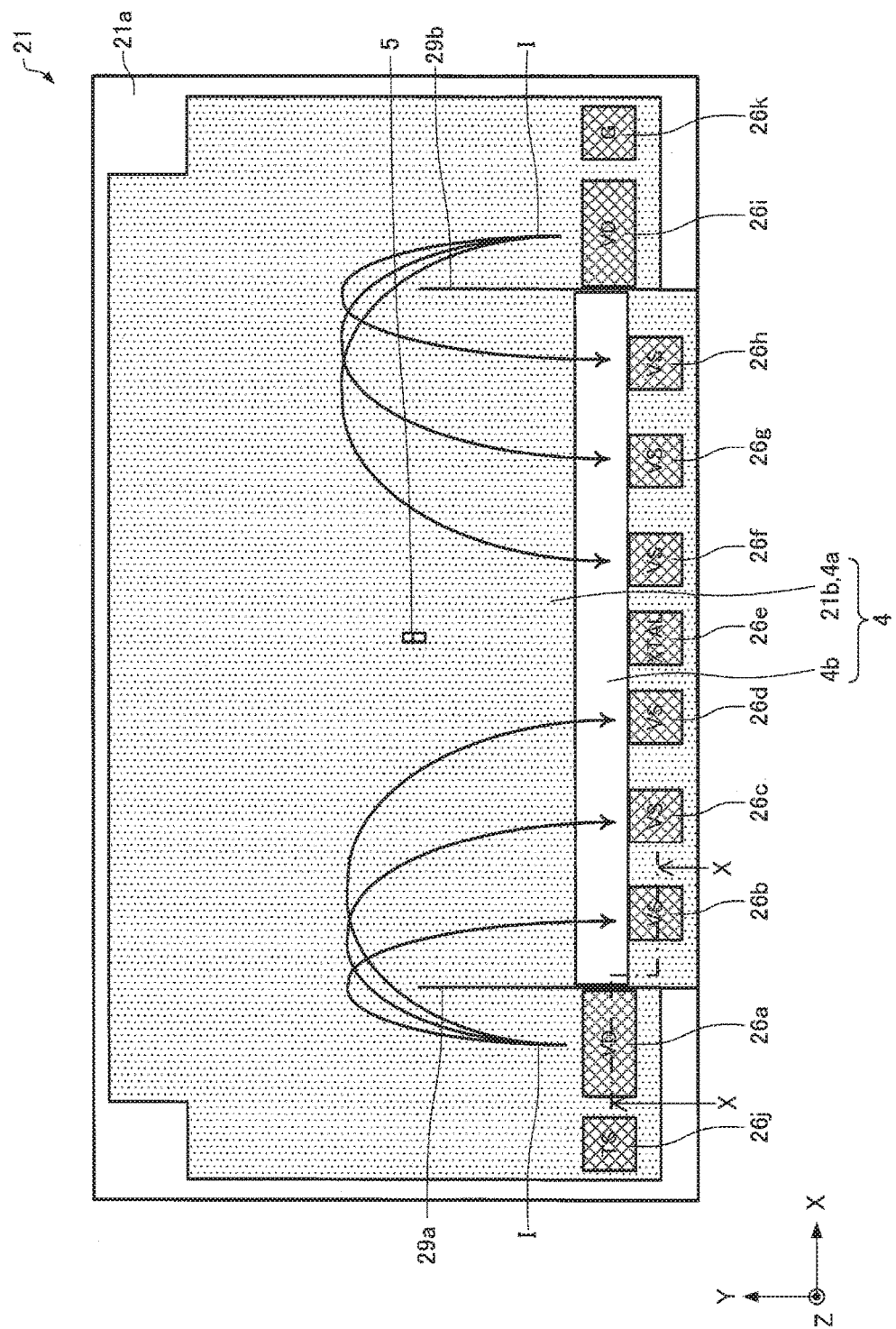
FIG. 9 is a plan view schematically showing an integrated circuit substrate of the integrated circuit device.
Figure 10:
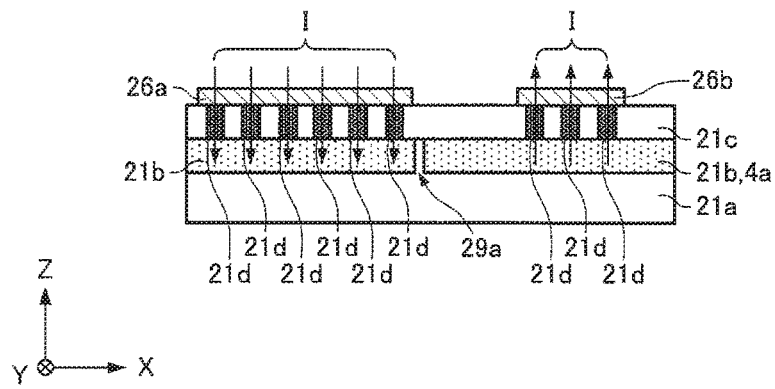
FIG. 10 is a sectional view schematically showing the integrated circuit substrate of the integrated circuit device.

FIG. 9 is a plan view schematically showing the integrated circuit substrate 21 of the integrated circuit device 20. FIG. 10 is a sectional view schematically showing the integrated circuit substrate 21 of the integrated circuit device 20 along line X-X in FIG. 9.

As shown in FIGS. 9 and 10, the integrated circuit substrate 21 includes a semiconductor substrate 21a, a diffusion layer 21b, an insulating layer 21c, and the electrodes 26a to 26k. The integrated circuit substrate 21 further includes the MOS transistor 4b forming the heat generation circuit 4 and the temperature sensor 5.

The semiconductor substrate 21a is e.g. a silicon substrate. The semiconductor substrate 21a is not limited to the silicon substrate, but may be a substrate formed of a semiconductor material. The semiconductor substrate 21a is e.g. a P-type semiconductor substrate.

The diffusion layer 21b is an N-type diffusion layer formed by doping of an impurity of phosphorus (P) or the like in the surface of the P-type semiconductor substrate 21a. The diffusion layer 21b functions as the resistance 4a of the heat generation circuit 4 shown in FIG. 4. Note that the semiconductor substrate 21a may be an N-type semiconductor substrate and the diffusion layer 21b may be a P-type diffusion layer formed by doping of an impurity of boron (B) or the like in the surface of the N-type semiconductor substrate 21a.

The insulating layer 21c is formed on the diffusion layer 21b. The material of the insulating layer 21c is e.g. silicon dioxide ($SiO_2$).

The electrodes 26a to 26k are formed on the insulating layer 21c.

The electrode 26a is electrically connected to the diffusion layer 21b via a plurality of vias 21d provided in the insulating layer 21c. The electrode 26a functions as an electrode for applying the power supply voltage to the diffusion layer 21b. Similarly, the electrode 26i is electrically connected to the diffusion layer 21b via a plurality of vias 21d provided in the insulating layer 21c. The electrode 26i functions as an electrode for applying the power supply voltage to the diffusion layer 21b.

The electrode 26b is electrically connected to the diffusion layer 21b via a plurality of vias 21d provided in the insulating layer 21c. The electrode 26b functions as an electrode for applying the ground voltage to the diffusion layer 21b. Similarly, the electrodes 26b, 26c, 26d, 26f, 26g, 26h are electrically connected to the diffusion layer 21b via a plurality of vias 21d provided in the insulating layer 21c. The electrodes 26b, 26c, 26d, 26f, 26g, 26h function as electrodes for applying the ground voltage to the diffusion layer 21b.

The electrode 26j is electrically connected to the bonding pad 24j that functions as the output terminal TS. The electrode 26k is electrically connected to the bonding pad 24k that functions as the input terminal G. The electrode 26e is electrically connected to the bonding pad 24e.

The material of the electrodes 26a to 26k is e.g. aluminum or an alloy primarily consisting of aluminum.

In the integrated circuit substrate 21, the MOS transistor 4b is provided in a region close to the electrodes 26b, 26c, 26d, 26e, 26f, 26g, 26h on the side in the +Y-axis direction in the plan view. The MOS transistor 4b includes wiring of polycrystal silicon or the like that functions as a gate, a diffusion layer that functions as a drain, a diffusion layer that functions as a source, etc.

Further, in the integrated circuit substrate 21, the temperature sensor 5 is provided in the region overlapping with the vibrator 2 in the plan view. That is, in the oven controlled crystal oscillator 100, the temperature sensor 5 and the vibrator 2 overlap in the plan view. Accordingly, the temperature sensor 5 may accurately detect the temperature of the vibrator 2.

In the integrated circuit substrate 21, a slit 29a is formed to intersect with an imaginary line connecting the electrode 26a and the electrode 26b (an imaginary line connecting the center of gravity of the electrode 26a and the center of gravity of the electrode 26b) in the plan view. Further, a slit 29b is formed to intersect with an imaginary line connecting the electrode 26i and the electrode 26h (an imaginary line connecting the center of gravity of the electrode 26i and the center of gravity of the electrode 26h) in the plan view. The slits 29a, 29b are regions in which the diffusion layer 21b is not formed. The slits 29a, 29b are regions having higher electric resistance than the diffusion layer 21b.

In the integrated circuit substrate 21, a potential difference is applied between a region of the diffusion layer 21b electrically connected to the electrodes 26a, 26i and a region of the diffusion layer 21b electrically connected to the electrodes 26b, 26c, 26d, 26f, 26g, 26h. Thereby, a current I flows and the diffusion layer 21b generates heat. In this regard, the currents I input from the electrodes 26a, 26i flow to the electrodes 26b, 26c, 26d, 26f, 26g, 26h around the slits 29a, 29b. Thereby, paths in which the currents I flow may be made longer and sufficient currents flow in the region of the diffusion layer 21b overlapping with the vibrator 2 in the plan view, and the vibrator 2 may be efficiently heated.

The oven controlled crystal oscillator 100 according to the first embodiment has the following features, for example.

The oven controlled crystal oscillator 100 includes the integrated circuit device 20. In the integrated circuit device 20, in the joining part 22 joined to the vibrator 2, the insulating protective film 23 covering a part of the surface of the integrated circuit substrate 21 as the substrate is provided, and no insulating protective film is provided between the adjacent bonding pads 24a to 24k. Accordingly, in the integrated circuit device 20, the insulating protective film 23 and the bonding pads 24a to 24k form no steps between the adjacent bonding pads 24a to 24k. Therefore, in the integrated circuit device 20, the problem that the capillary used for wire bonding collides with the steps formed by the insulating protective film and the bonding pads may be avoided and productivity of wire bonding may be improved. Thus, according to the oven controlled crystal oscillator 100, the integrated circuit device 20 is provided and the oven controlled crystal oscillator with higher productivity may be realized.

Further, in the oven controlled crystal oscillator of related art, the insulating protective film 23 and the bonding pads 24a to 24k form steps and, when joining strength (share strength) between the bonding pads 24a to 24k and the wires 14 is evaluated, a jig for applying load on bonding parts between the bonding pads 24a to 24k and the wires 14 may collide with the steps.

On the other hand, in the oven controlled crystal oscillator 100, the insulating protective film 23 and the bonding pads 24a to 24k form no steps between the adjacent bonding pads 24a to 24k, and the above described problem may be avoided. Therefore, according to the oven controlled crystal oscillator 100, the share strength may be easily evaluated.

In the oven controlled crystal oscillator 100, the integrated circuit device 20 includes the heat generation circuit 4 as the heat generator that generates heat and the temperature sensor 5 as the temperature detector that detects the ambient temperature. Accordingly, in the integrated circuit device 20, the heat generation circuit 4 and the temperature sensor 5 may be provided close to the vibrator 2, and the vibrator 2 may be efficiently heated and the temperature of the vibrator 2 may be accurately detected. Therefore, according to the oven controlled crystal oscillator 100, the oven controlled crystal oscillator with lower power consumption and higher accuracy may be realized.

In the oven controlled crystal oscillator 100 according to the first embodiment, the oscillation circuit 3 (oscillation IC 30) for oscillating the vibrator 2 is provided, and thereby, as described above, the oscillator with higher productivity may be realized.

2. Second Embodiment

Figure 11:
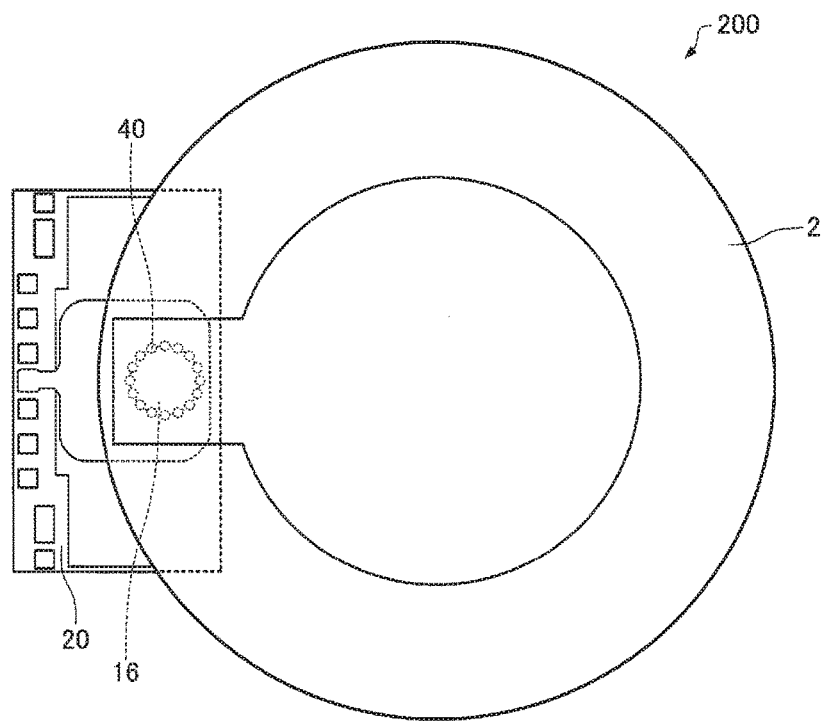
FIG. 11 is a plan view schematically showing an oven controlled crystal oscillator according to the second embodiment.
Figure 12:
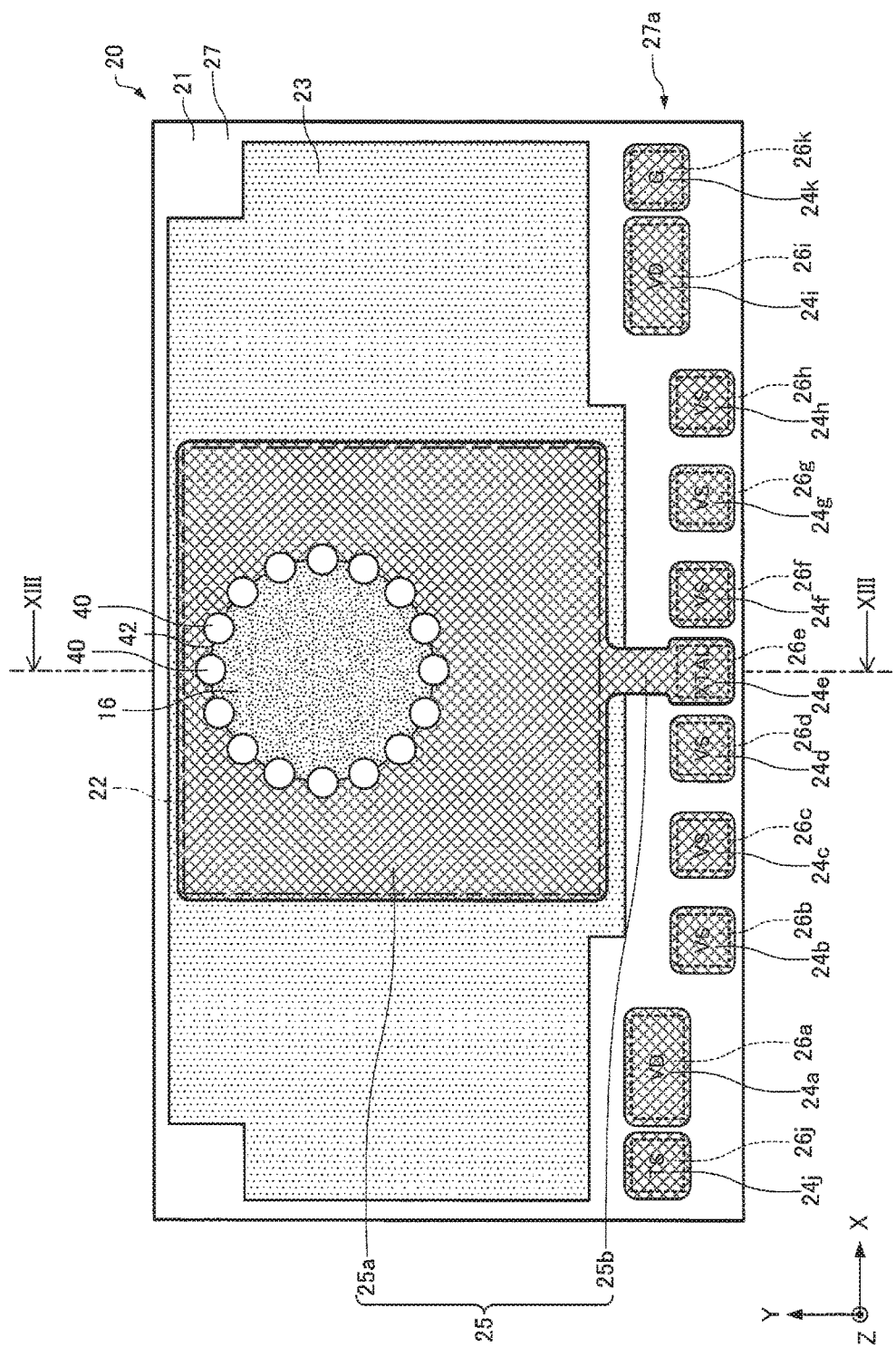
FIG. 12 is a plan view schematically showing an integrated circuit device of the oven controlled crystal oscillator according to the second embodiment.
Figure 13:
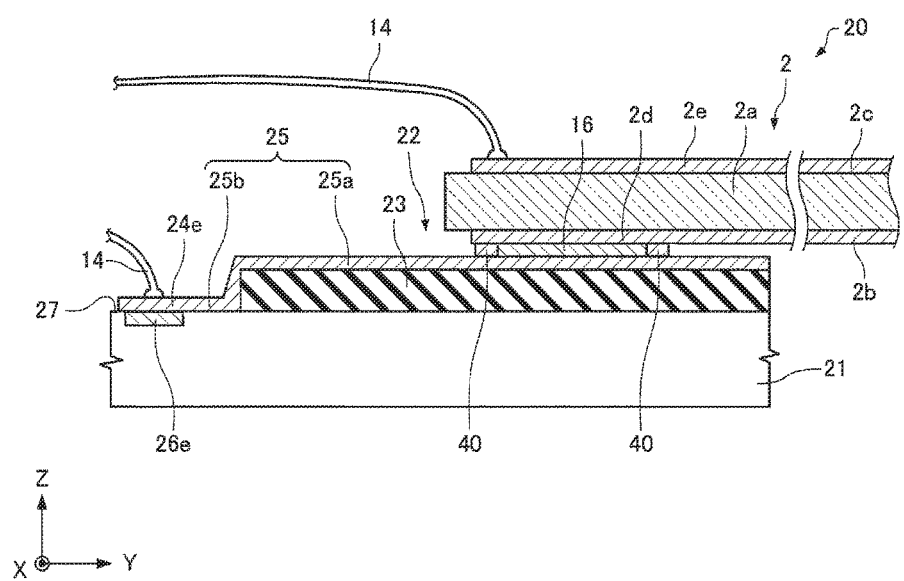
FIG. 13 is a sectional view schematically showing the integrated circuit device of the oven controlled crystal oscillator according to the second embodiment.

FIG. 11 is a plan view schematically showing an oven controlled crystal oscillator 200 according to the second embodiment. FIG. 12 is a plan view schematically showing an integrated circuit device 20 of the oven controlled crystal oscillator 200 according to the second embodiment. FIG. 13 is a sectional view schematically showing the integrated circuit device 20 of the oven controlled crystal oscillator 200 according to the second embodiment along line XIII-XIII in FIG. 12.

Note that, in FIG. 11, for convenience, the package 10, the lid 12, and the oscillation IC 30 are not shown. Further, FIG. 13 shows a state in which the vibrator 2 is fixed to the integrated circuit device 20. In FIGS. 12 and 13, an X-axis, a Y-axis, and a Z-axis are shown as three axes orthogonal to one another.

As below, in the oven controlled crystal oscillator 200 according to the second embodiment, members having the same functions as the component elements of the oven controlled crystal oscillator 100 according to the first embodiment have the same signs and their detailed explanation will be omitted.

In the oven controlled crystal oscillator 200, as shown in FIGS. 11 to 13, a plurality of bump members 40 are provided in the joining part 22 of the integrated circuit device 20.

The bump members 40 are provided on the conducting pattern 25. The bump members 40 are projections provided on the conducting pattern 25. The bump members 40 are metal bumps such as gold bumps or solder bumps, for example.

16 of the bump members 40 are provided in the illustrated example, and the number is not particularly limited. The plurality of bump members 40 are provided separately from each other. Gaps 42 are provided between the adjacent bump members 40. It is preferable that the sizes of the gaps 42 (i.e., the distances between the adjacent bump members 40) are sizes in which the conductive joining material 16 applied in a region surrounded by the plurality of bump members 40 may be held back when the vibrator 2 is joined to the joining part 22.

The plurality of bump members 40 are arranged in a circular form in the plan view. That is, the plurality of bump members 40 are located on one imaginary circle in the plan view. In the illustrated example, the positions of the centers of gravity of the plurality of bump members 40 are located on one imaginary circle in the plan view, however, the positions of the centers of gravity of the plurality of bump members 40 are not necessarily located on one imaginary circle in the plan view.

The plurality of bump members 40 are arranged at equal intervals on the imaginary circle in the plan view. That is, in the plurality of bump members 40 arranged on the imaginary circle, the sizes of the gaps 42 are equal to each other. Note that, in the plurality of bump members 40 arranged on the imaginary circle, the sizes of the gaps 42 may be different from each other.

The plurality of bump members 40 are provided between the conducting pattern 25 and the lead electrode 2d of the vibrator 2. The plurality of bump members 40 are sandwiched between the conducting pattern 25 and the lead electrode 2d in contact with the lead electrode 2d.

At least a part of the conductive joining material 16 is surrounded by the plurality of bump members 40 in the plan view. In other words, in the plan view, at least the part of the conductive joining material 16 exists inside of a figure formed by an imaginary line connecting the centers of gravity of the plurality of bump members 40.

As described above, at least the part of the conductive joining material 16 is surrounded by the plurality of bump members 40, and thereby, spread of the conductive joining material 16 when the vibrator 2 is joined to the joining part 22 may be reduced. For example, when the vibrator 2 is joined to the joining part 22, the conductive joining material 16 is applied to the region surrounded by the plurality of bump members 40 and the vibrator 2 is joined to the joining part 22, and thereby, the spread of the conductive joining material 16 may be reduced by the plurality of bump members 40. Accordingly, for example, when the vibrator 2 is joined to the joining part 22, the spread of the conductive joining material 16 over the vibration region of the vibrator 2 to affect the vibration of the vibrator 2 (e.g. a fall of the Q-value of the vibrator) may be prevented.

Note that, in the example shown in FIG. 12, the plurality of bump members 40 are arranged in the circular form in the plan view, however, the arrangement of the plurality of bump members 40 is not limited to that as long as the bump members may surround at least a part of the conductive joining material 16.

Figure 14:
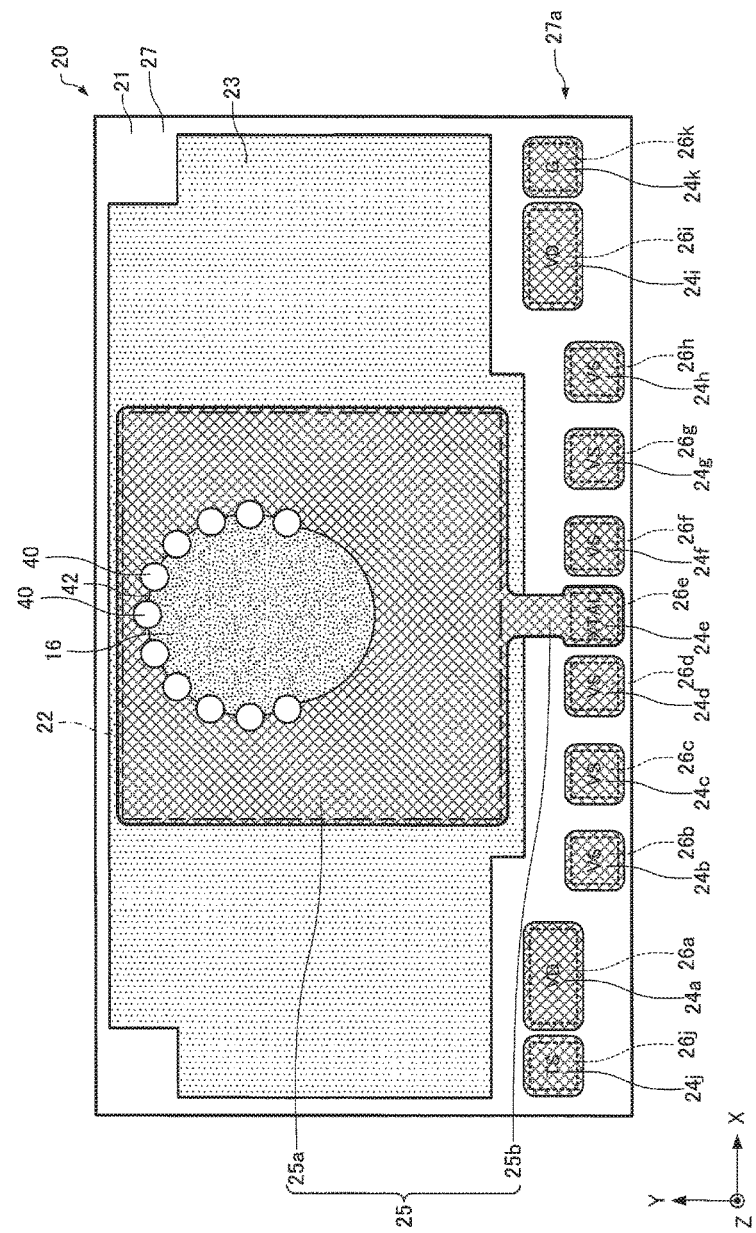
FIG. 14 shows another example of an arrangement of a plurality of bump members of the integrated circuit device.
Figure 15:
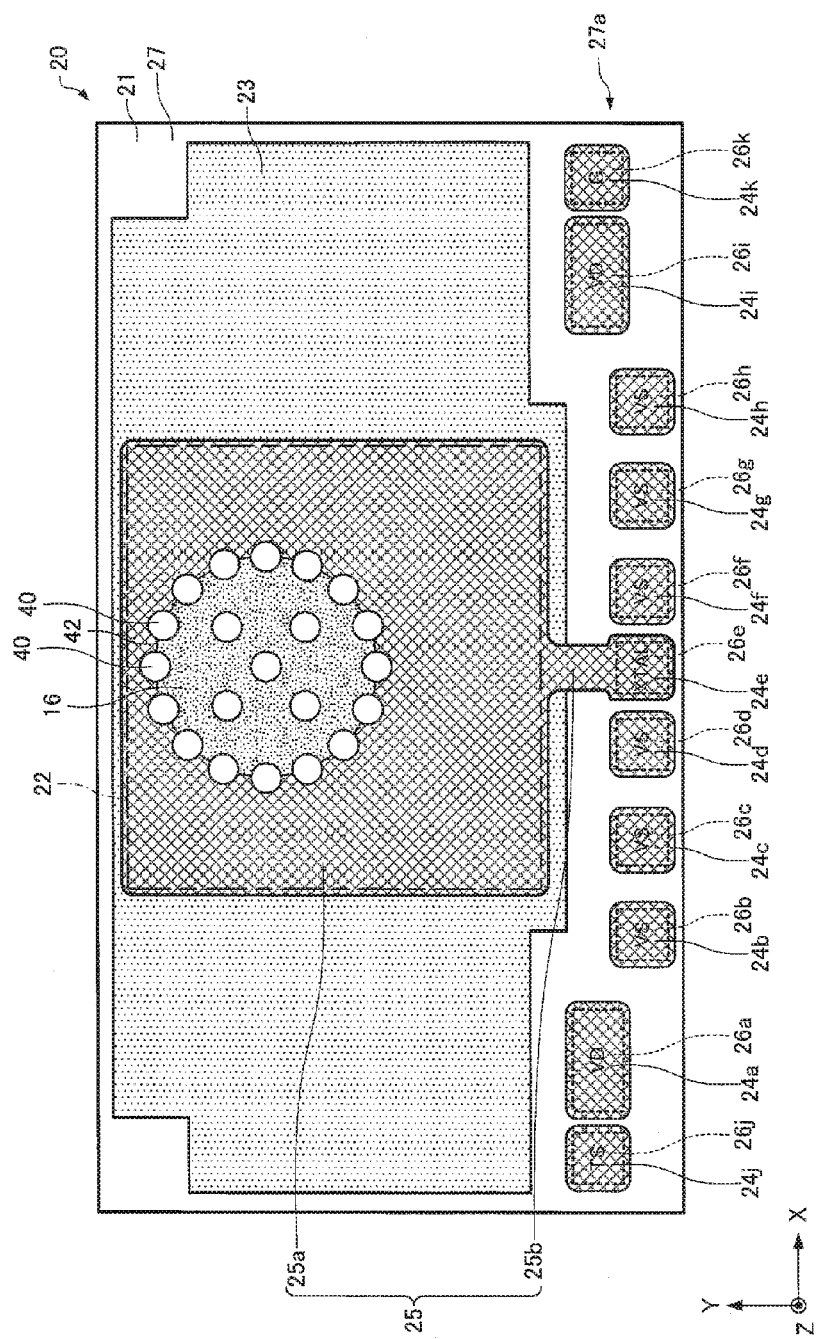
FIG. 15 shows another example of the arrangement of the plurality of bump members of the integrated circuit device.
Figure 16:
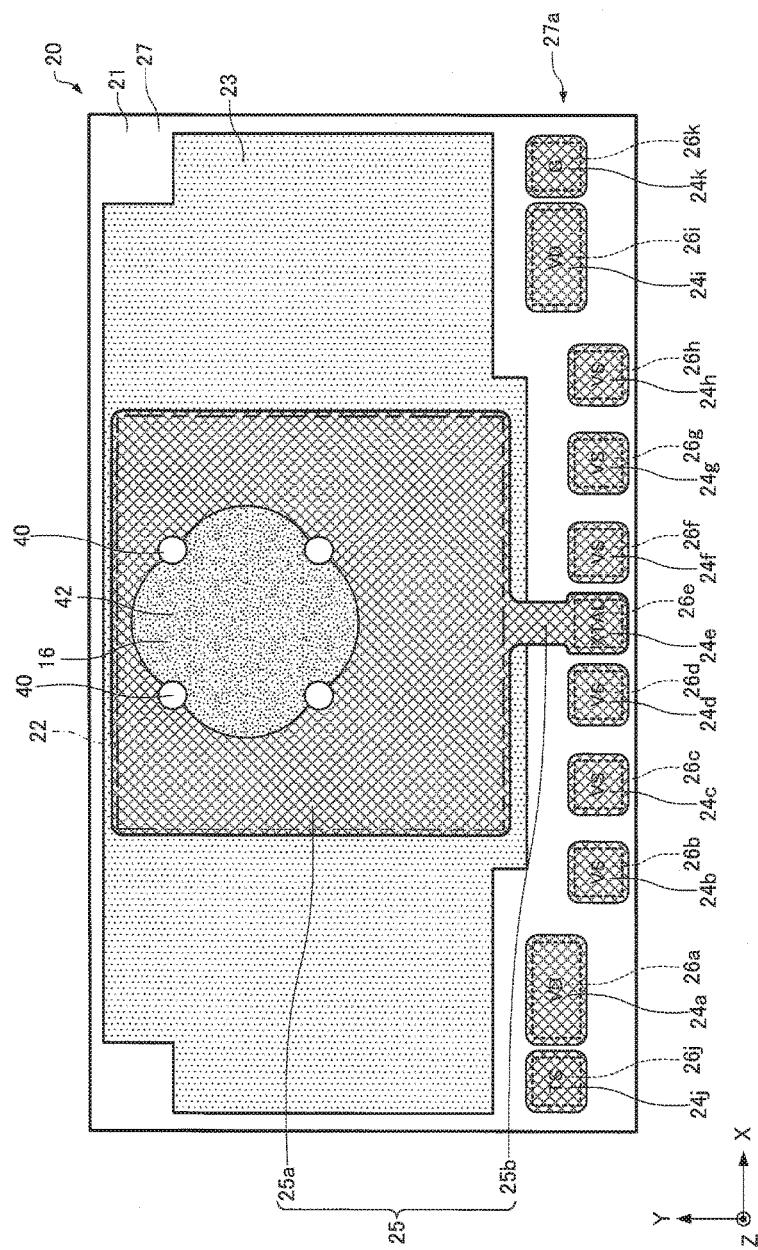
FIG. 16 shows another example of the arrangement of the plurality of bump members of the integrated circuit device.

FIGS. 14 to 16 schematically show the integrated circuit device 20 of the oven controlled crystal oscillator 200 according to the second embodiment and show other examples of the arrangement of the plurality of bump members 40.

As shown in FIG. 14, the plurality of bump members 40 may be arranged in an arc form in the plan view. That is, the plurality of bump members 40 are located on one imaginary arc in the plan view. The arrangement of the plurality of bump members 40 in the arc form may be an arrangement of at least part of the plurality of bump members 40 provided in the joining part 22 in an arc form. The case where the plurality of bump members 40 in the arc form includes e.g. the case where the plurality of bump members 40 are arranged in an circular form (see FIG. 12) and the case where the plurality of bump members 40 are arranged in an oval form containing a part in which the bump members are provided in a circular form (see FIG. 27).

In the example shown in FIG. 14, the gaps 42 between the plurality of bump members 40 on the vibration region side (on the side in the +Y direction) of the vibrator 2 are small enough to hold back the conductive joining material 16. Accordingly, spread of the conductive joining material 16 to the vibration region side may be reduced and the influence on the vibration of the vibrator 2 may be reduced. Further, in the example shown in FIG. 14, the gaps between the plurality of bump members 40 on the opposite side (on the side in the −Y direction) to the vibration region side are larger than the gaps 42 on the vibration region side. Accordingly, the excess conductive joining material 16 maybe allowed to escape to the opposite side to the vibration region side.

Or, as shown in FIG. 15, the plurality (16) of bump members 40 are arranged in a circular form in the plan view and a plurality (five) of bump members 40 are arranged inside of the circularly arranged plurality (16) of bump members 40. As described above, the bump members 40 are further arranged inside of the plurality of bump members 40 arranged to surround the conductive joining material 16, and thereby, when the vibrator 2 is joined to the joining part 22, uniformity of the thickness of the conductive joining material 16 maybe improved. Further, by the bump members 40 arranged inside of the plurality of bump members 40 arranged to surround the conductive joining material 16, the surface area of the joining surface may be increased, and joining strength between the joining part 22 and the vibrator 2 may be improved.

Or, as shown in FIG. 16, four bump members 40 may be arranged in a circular form in the plan view. Or, as shown in FIG. 17, four bump members 40 may be arranged in a circular form in the plan view and one bump member 40 may be placed inside of the circularly arranged four bump members 40.

Figure 17:
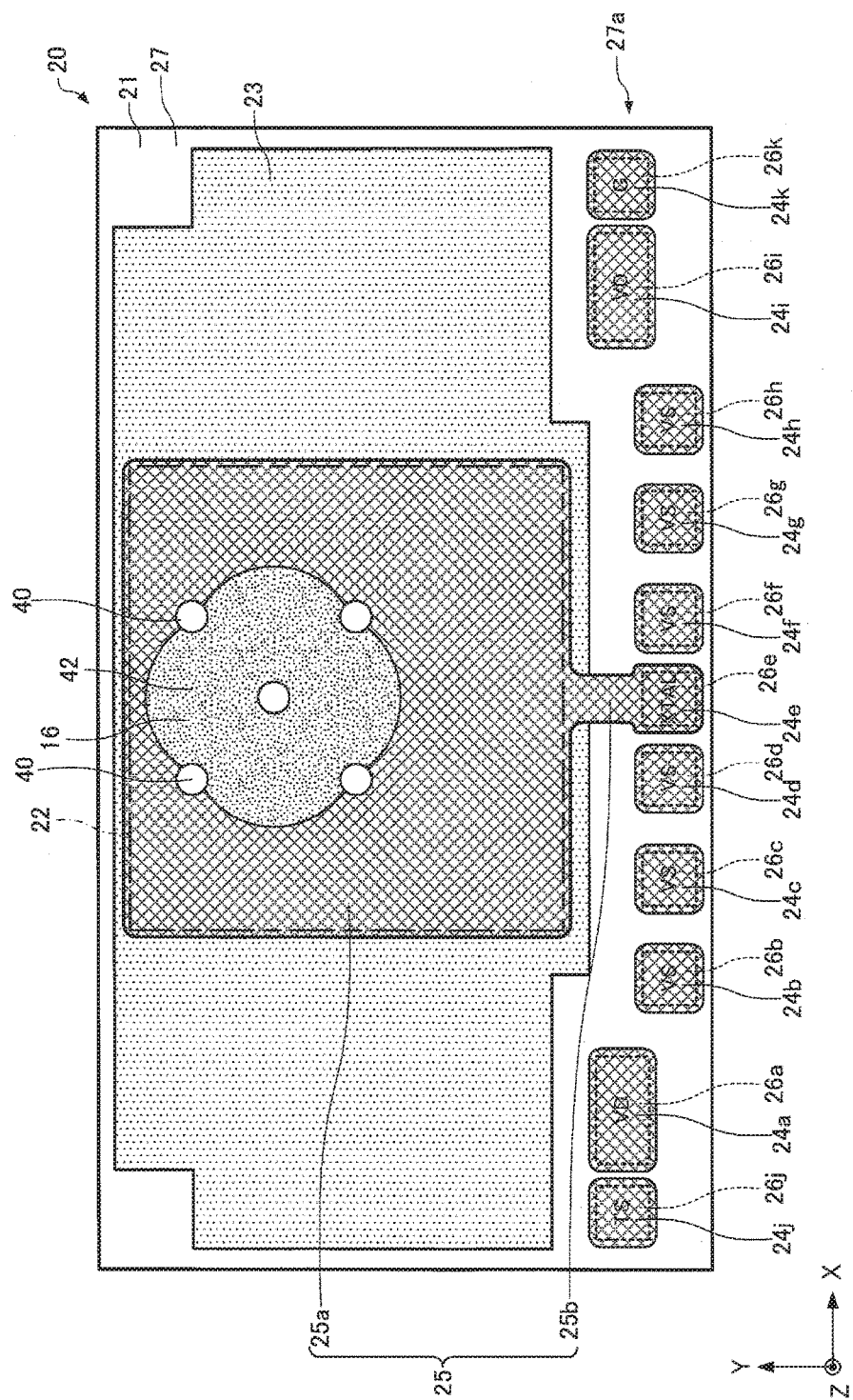
FIG. 17 shows another example of the arrangement of the plurality of bump members of the integrated circuit device.

As shown in FIGS. 16 and 17, in the plurality of bump members 40 arranged to surround the conductive joining material 16, the sizes of the gaps 42 may be larger than sizes that can hold back the conductive joining material 16 when the vibrator 2 is joined to the joining part 22. Even in this case, when the vibrator 2 is joined to the joining part 22, the bump members 40 may surround a part of the conductive joining material 16, and spread of the conductive joining material 16 may be reduced compared to the case where the bump members 40 are not provided.

Note that the plurality of bump members 40 are not necessarily arranged in a circular (arc) form as long as the bump members are provided to surround at least a part of the conductive joining material 16 in the plan view. Although not illustrated, the plurality of bump members 40 may be arranged in a polygonal form, an elliptical form, or the like in the plan view, for example.

The oven controlled crystal oscillator 200 according to the second embodiment has the following features, for example.

In the oven controlled crystal oscillator 200, the conductive joining material 16 is surrounded by the plurality of bump members 40 provided in the joining part 22, and thereby, spread of the conductive joining material 16 when the vibrator 2 is joined to the joining part 22 may be reduced. Accordingly, in the oven controlled crystal oscillator 200, when the vibrator 2 is joined to the joining part 22, the spread of the conductive joining material 16 over the vibration region of the vibrator 2 to affect the vibration of the vibrator 2 may be prevented. For example, in the oven controlled crystal oscillator 200, a fall of the Q-value of the vibrator due to the spread of the conductive joining material 16 over the vibration region of the vibrator 2 may be reduced, and thereby, variations in impedance may be reduced.

In the oven controlled crystal oscillator 200, the plurality of bump members 40 are separated from each other. Accordingly, when the vibrator 2 is joined to the joining part 22, the spread of the conductive joining material 16 may be reduced and the excess conductive joining material 16 may be allowed to escape from the region surrounded by the plurality of bump members 40.

In the oven controlled crystal oscillator 200, the plurality of bump members 40 are arranged in the circular form, and the spread of the conductive joining material 16 when the vibrator 2 is joined to the joining part 22 may be reduced.

Further, in the oven controlled crystal oscillator 200, the same advantages as those of the above described oven controlled crystal oscillator 100 may be obtained.

3. Third Embodiment

Figure 18:
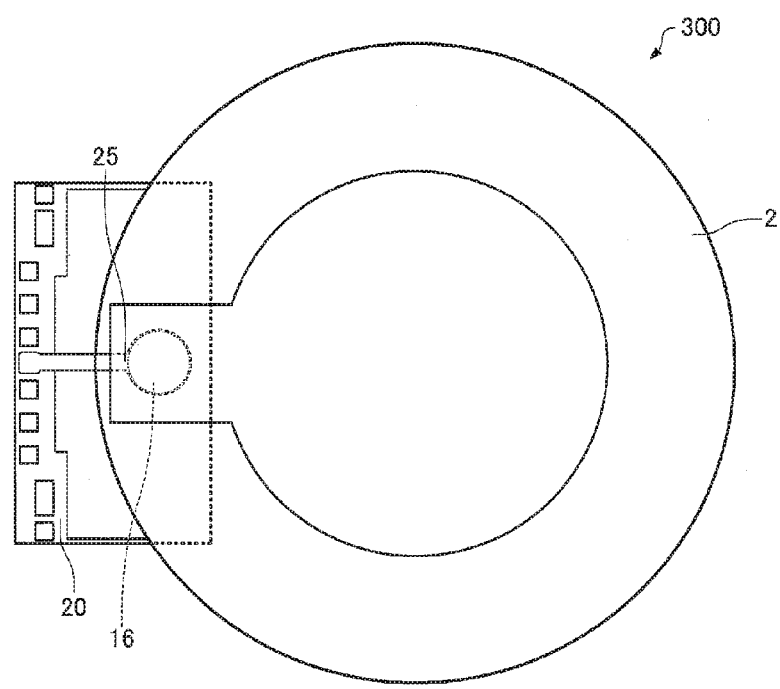
FIG. 18 is a plan view schematically showing an oven controlled crystal oscillator according to the third embodiment.
Figure 19:
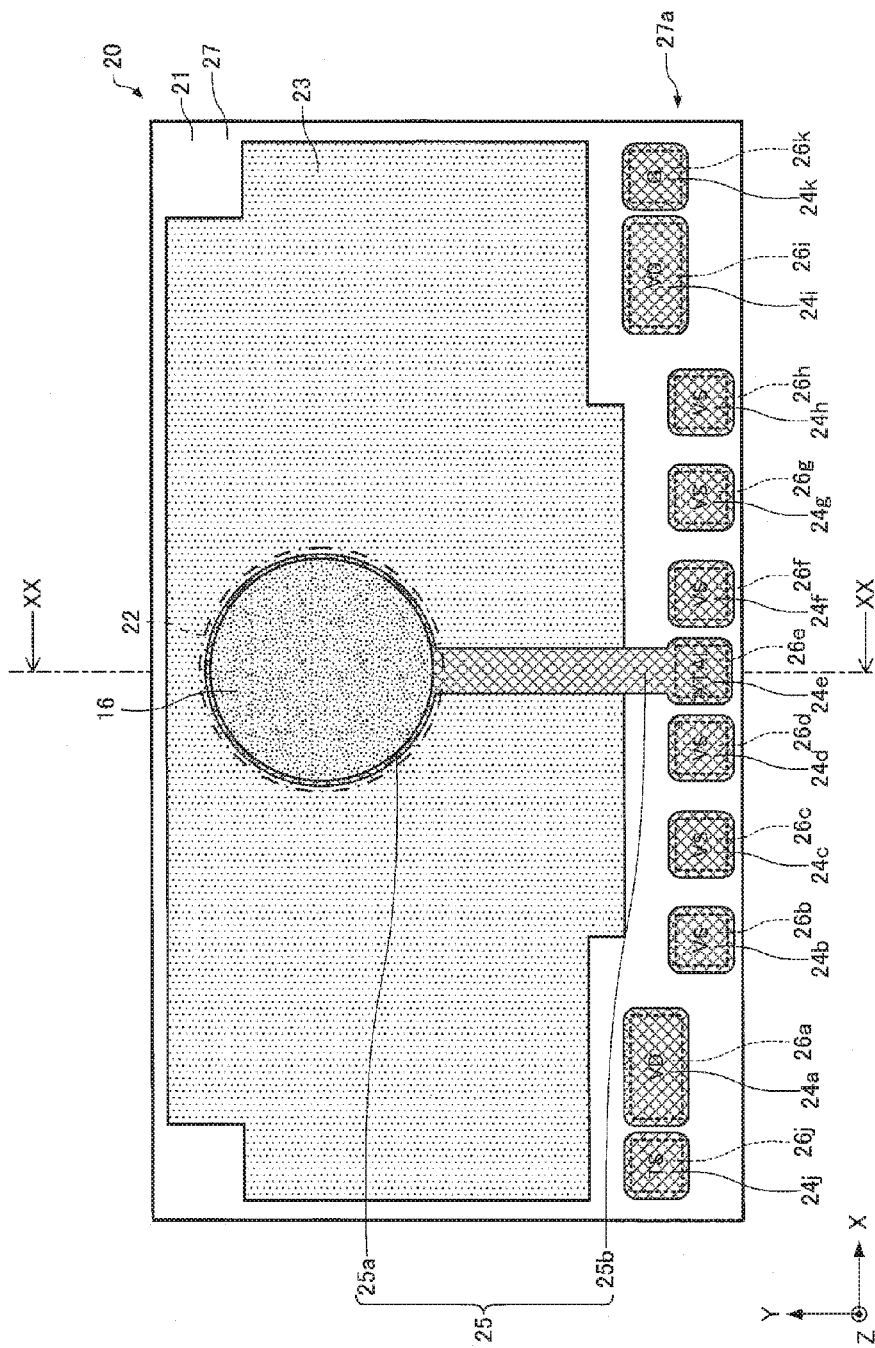
FIG. 19 is a plan view schematically showing an integrated circuit device of the oven controlled crystal oscillator according to the third embodiment.
Figure 20:
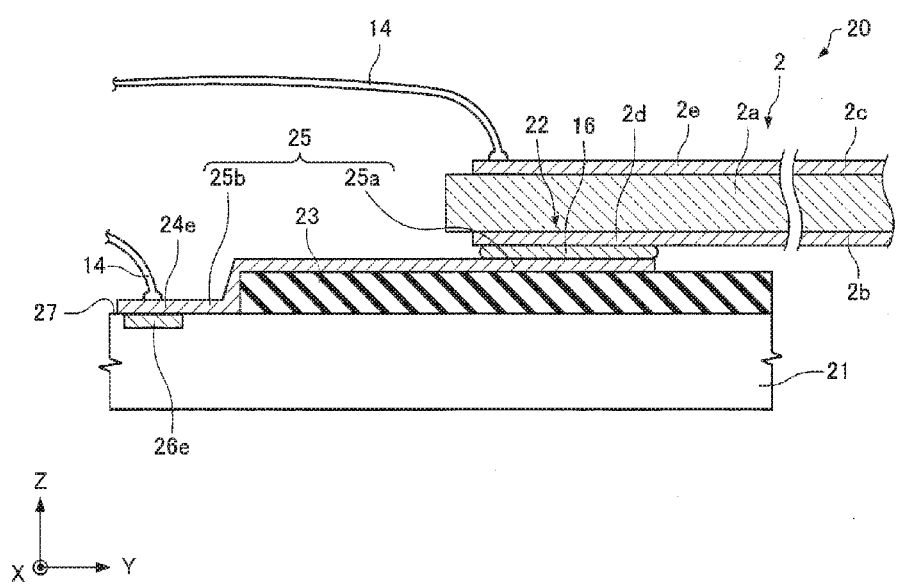
FIG. 20 is a sectional view schematically showing the integrated circuit device of the oven controlled crystal oscillator according to the third embodiment.

FIG. 18 is a plan view schematically showing an oven controlled crystal oscillator 300 according to the third embodiment. FIG. 19 is a plan view schematically showing an integrated circuit device 20 of the oven controlled crystal oscillator 300 according to the third embodiment. FIG. 20 is a sectional view schematically showing the integrated circuit device 20 of the oven controlled crystal oscillator 300 according to the third embodiment along line XX-XX in FIG. 19.

Note that, in FIG. 18, for convenience, the package 10, the lid 12, and the oscillation IC 30 are not shown. Further, in FIGS. 19 and 20, an X-axis, a Y-axis, and a Z-axis are shown as three axes orthogonal to one another.

As below, in the oven controlled crystal oscillator 300 according to the third embodiment, members having the same functions as the component elements of the oven controlled crystal oscillator 100 according to the first embodiment and the oven controlled crystal oscillator 200 according to the second embodiment have the same signs and their detailed explanation will be omitted.

In the oven controlled crystal oscillator 300, as shown in FIGS. 18 to 20, the conducting pattern 25 has a circular joining electrode 25a in the plan view.

Further, in the embodiment, the joining electrode 25a is formed in a size of the contact surface between the conductive joining material 16 and the joining electrode 25a in advance. In other words, the joining electrode 25a is formed so that the area of the upper surface of the joining electrode 25a and the area of the contact region in which the upper surface and the conductive joining material 16 are in contact may be equal.

Here, when the vibrator 2 is joined to the joining part 22, on the outer edge of the joining electrode 25a (the boundary between the joining electrode 25a and another member (or space)), the conductive joining material 16 is harder to spread compared to that on the joining electrode 25a. For example, in the above described oven controlled crystal oscillator 100, as shown in FIG. 6, the size of the joining electrode 25a is sufficiently larger than the size of the contact region between the conductive joining material 16 and the joining electrode 25a, and the conductive joining material 16 is easier to spread. On the other hand, in the embodiment, the size of the joining electrode 25a is formed to be the size of the contact region between the conductive joining material 16 and the joining electrode 25a, and thereby, the spread of the conductive joining material 16 when the vibrator 2 is joined to the joining part 22 may be reduced.

Further, in the embodiment, as described above, the conducting pattern 25 has the circular joining electrode 25a in the plan view. Here, for example, when the joining electrode 25a has a corner portion in the plan view, the conductive joining material 16 is hard to spread to the corner portion. On the other hand, in the embodiment, the joining electrode 25a is configured in the circular shape, i.e. by a curve without a corner portion, and thus, the conductive joining material 16 may be spread over the enter upper surface of the joining electrode 25a. Accordingly, for example, even when the area of the joining electrode 25a with a corner portion and the area of the joining electrode 25a without a corner portion are the same, the contact region between the conductive joining material 16 and the joining electrode 25a may be made larger in the case without a corner portion. Therefore, in the embodiment, the spread of the conductive joining material 16 when the vibrator 2 is joined to the joining part 22 may be reduced and the joining strength between the vibrator 2 and the joining part 22 maybe efficiently improved.

Note that, in the example shown in FIG. 19, the joining electrode 25a is provided in the circular form in the plan view, however, the planar shape of the joining electrode 25a is not limited to that.

FIGS. 21 to 24 schematically show the integrated circuit device 20 of the oven controlled crystal oscillator 300 according to the third embodiment and show other examples of the shape of the joining electrode 25a.

As shown in FIGS. 21 to 24, the joining electrode 25a may have an oval shape in the plan view. Here, the oval shape refers to a shape formed by a smooth and closed curve and close to an elongated circle or an ellipse. The oval shape includes e.g. an egg shape, an elongated circular shape, and an elliptical shape.

Figure 21:
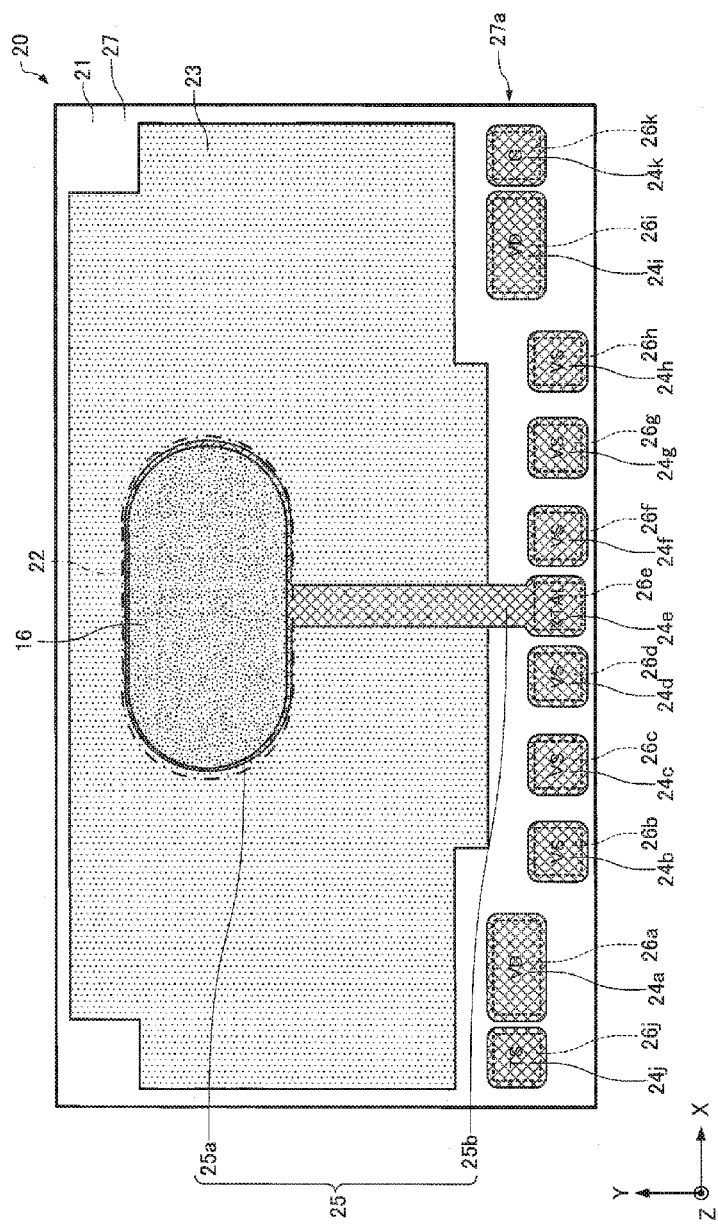
FIG. 21 shows another example of a shape of a joining electrode.
Figure 22:
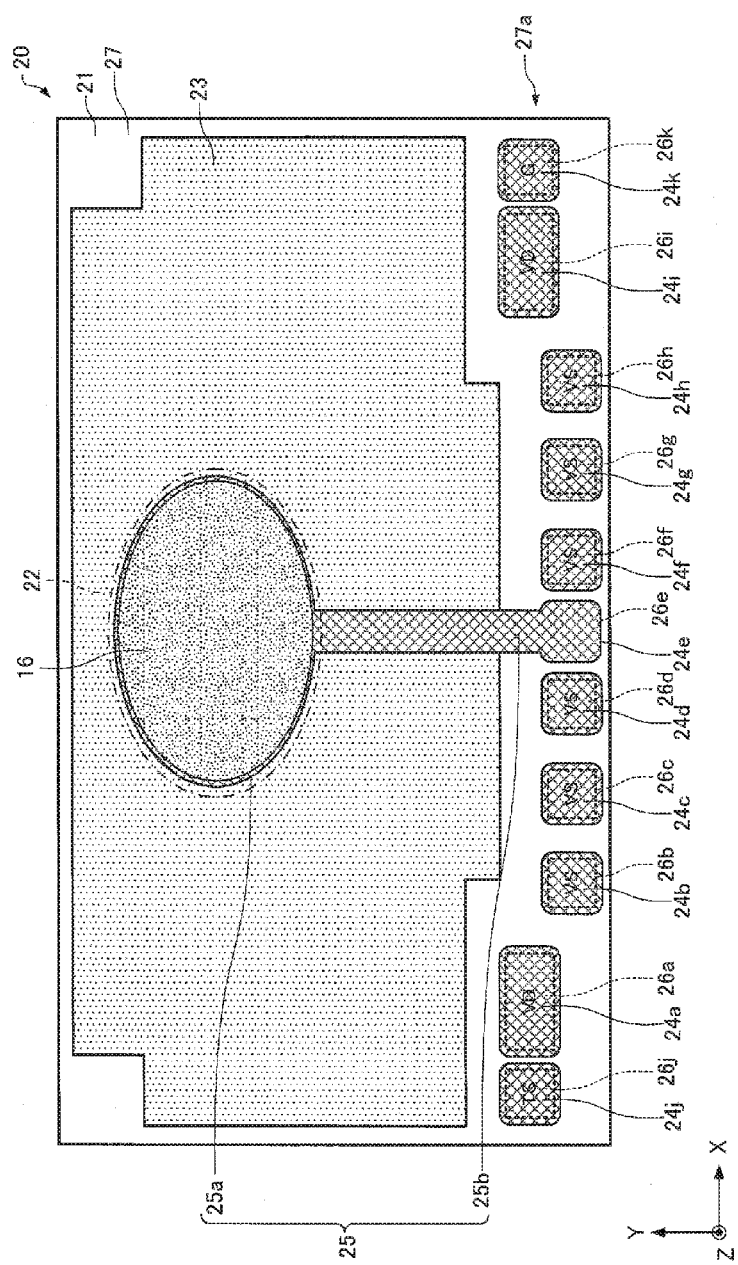
FIG. 22 shows another example of the shape of the joining electrode.
Figure 23:
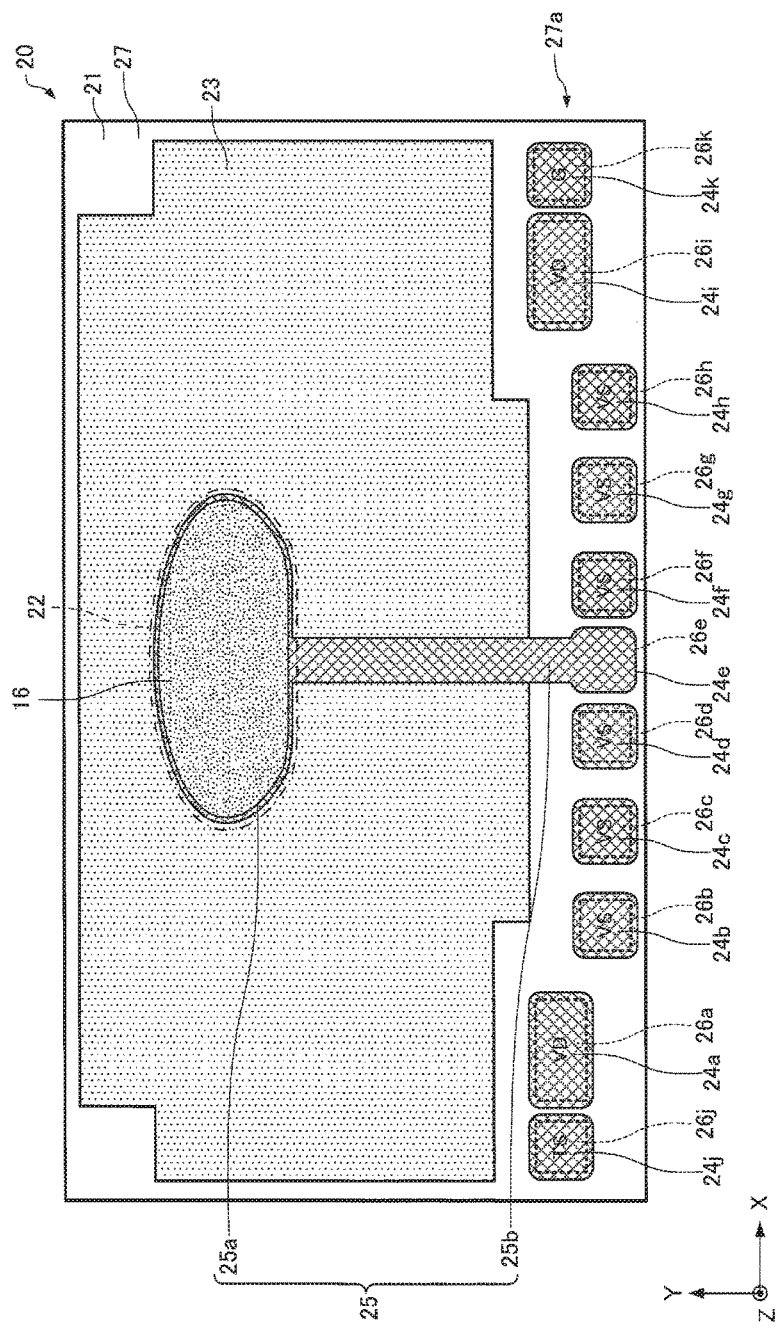
FIG. 23 shows another example of the shape of the joining electrode.
Figure 24:
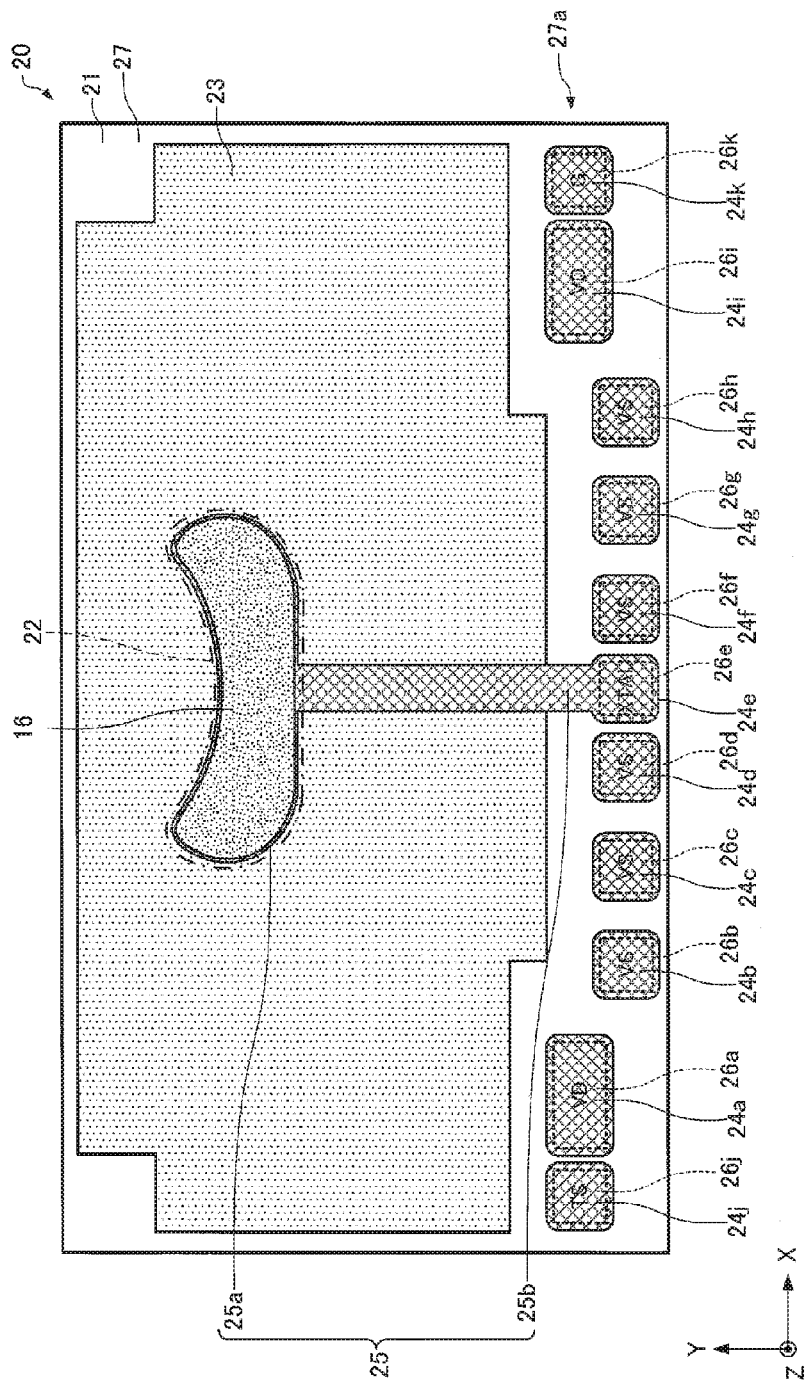
FIG. 24 shows another example of the shape of the joining electrode.

The oval shape includes e.g. an elongated circular shape shown in FIG. 21, an elliptical shape shown in FIG. 22, a partially distorted egg shape shown in FIG. 23, and a partially recessed egg shape shown in FIG. 24.

The joining electrode 25a is formed in the oval shape, i.e., by a curve without a corner portion in the plan view, and thereby, as described above, the spread of the conductive joining material 16 when the vibrator 2 is joined to the joining part 22 may be reduced and the joining strength between the vibrator 2 and the joining part 22 may be efficiently improved.

The oven controlled crystal oscillator 300 according to the third embodiment has the following features, for example.

In the oven controlled crystal oscillator 300, the conducting pattern 25 has an oval shape and has the joining electrode 25a joined to the vibrator 2, and thereby, as described above, the spread of the conductive joining material 16 when the vibrator 2 is joined to the joining part 22 may be reduced and the joining strength between the vibrator 2 and the joining part 22 may be efficiently improved.

Further, in the oven controlled crystal oscillator 300, the same advantages as those of the above described oven controlled crystal oscillator 100 may be obtained.

4. Fourth Embodiment

Figure 25:
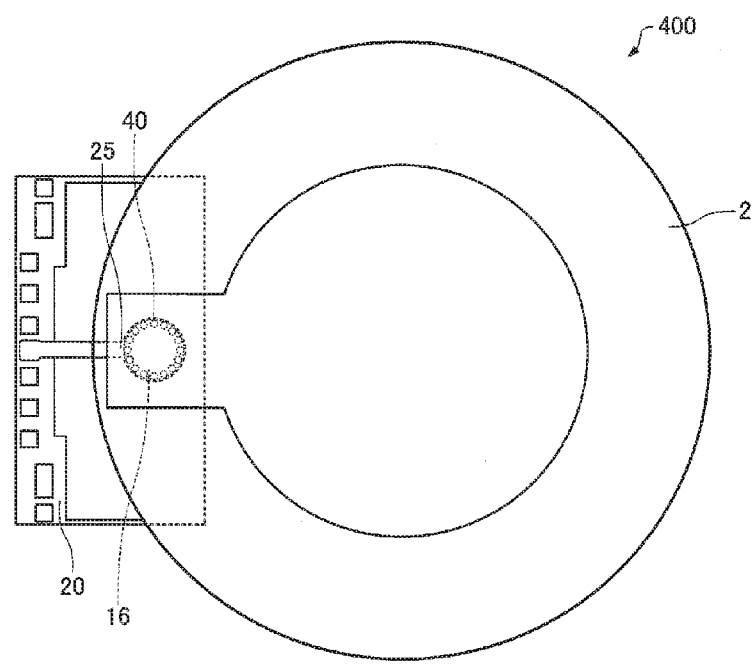
FIG. 25 is a plan view schematically showing an oven controlled crystal oscillator according to the fourth embodiment.
Figure 26:
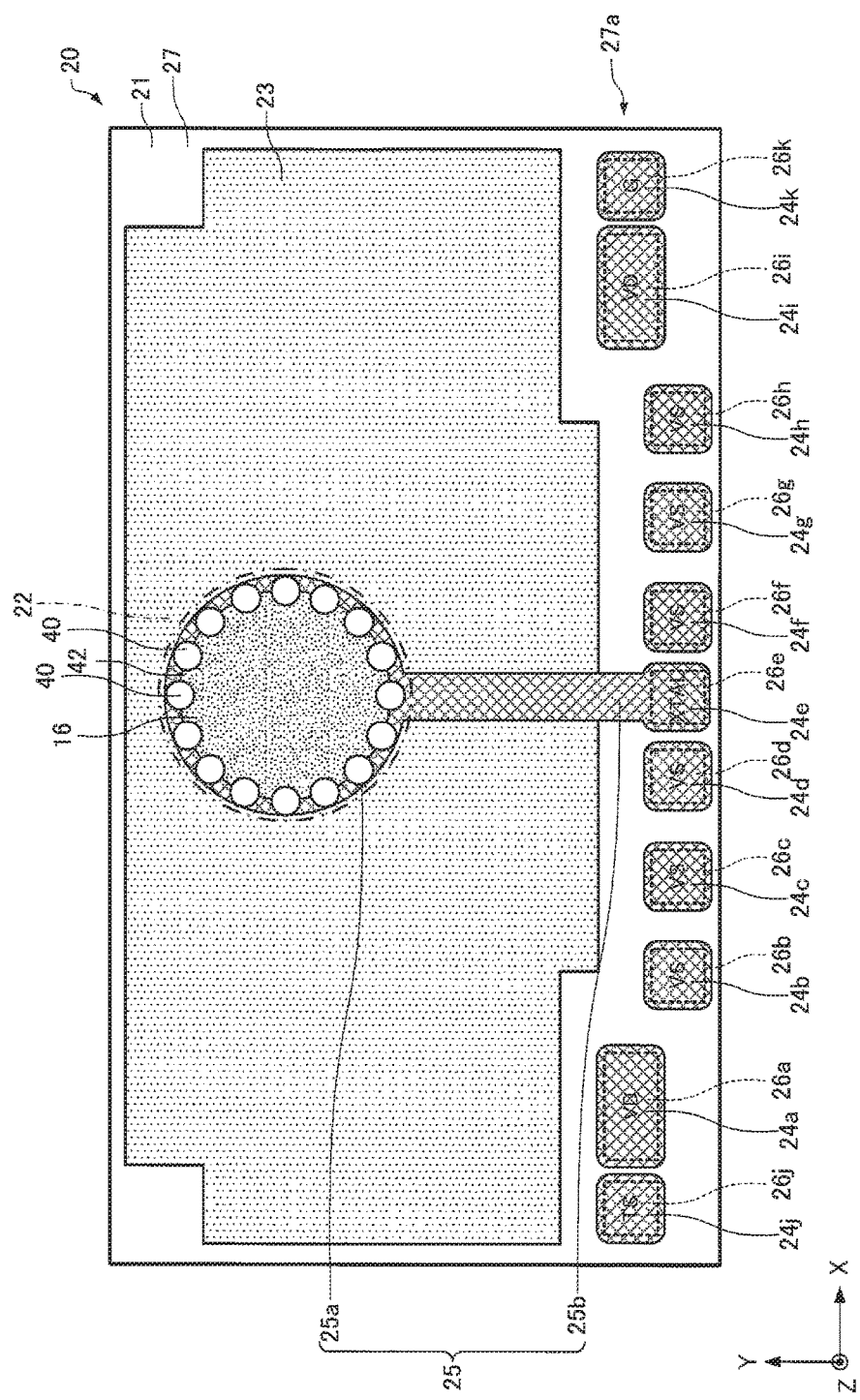
FIG. 26 is a plan view schematically showing an integrated circuit device of the oven controlled crystal oscillator according to the fourth embodiment.

FIG. 25 is a plan view schematically showing an oven controlled crystal oscillator 400 according to the fourth embodiment. FIG. 26 is a plan view schematically showing an integrated circuit device 20 of the oven controlled crystal oscillator 400 according to the fourth embodiment.

Note that, in FIG. 25, for convenience, the package 10, the lid 12, and the oscillation IC 30 are not shown. Further, in FIG. 26, an X-axis, a Y-axis, and a Z-axis are shown as three axes orthogonal to one another.

As below, in the oven controlled crystal oscillator 400 according to the fourth embodiment, members having the same functions as the component elements of the oven controlled crystal oscillators 100, 200, 300 according to the first to third embodiments have the same signs and their detailed explanation will be omitted.

In the oven controlled crystal oscillator 400, as shown in FIGS. 25 and 26, a plurality of bump members 40 are provided in the joining part 22 of the integrated circuit device 20 and the conducting pattern 25 has a circular (arc-shaped) joining electrode 25a in the plan view.

As shown in FIG. 26, the plurality of bump members 40 are arranged along the outer edge of the circular (arc-shaped) joining electrode 25a. The conductive joining material 16 is surrounded by the bump members 40 arranged along the outer edge of the circular joining electrode 25a on the joining electrode 25a.

Note that, in the example shown in FIG. 26, the plurality of bump members 40 are arranged along the outer edge of the circular joining electrode 25a, however, the joining electrode 25a may have various shapes and the plurality of bump members 40 may be arranged along the outer edges of the joining electrode 25a having various shapes.

Figure 27:
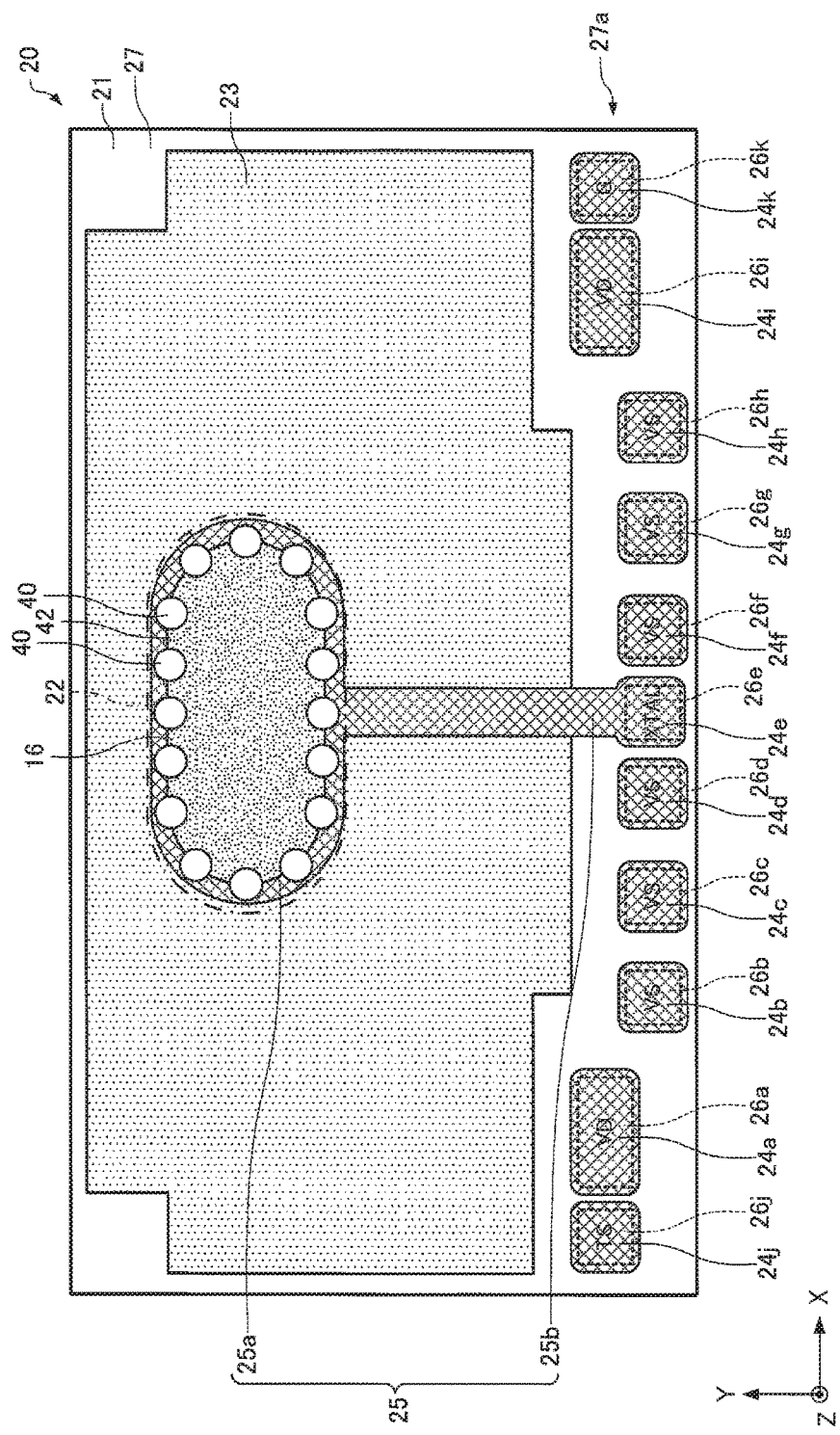
FIG. 27 shows another example of the arrangement of the plurality of bump members and the shape of the joining electrode.

FIG. 27 schematically shows the integrated circuit device 20 of the oven controlled crystal oscillator 400 according to the fourth embodiment and show another example of the arrangement of the plurality of bump members 40 and the shape of the joining electrode 25a.

As shown in FIG. 27, the joining electrode 25a may have an oval shape (elongated circular shape) and the plurality of bump members 40 maybe arranged along the outer edge of the joining electrode 25a having the oval shape (elongated circular shape).

Note that, in the case where the joining electrode 25a has the shapes shown in FIGS. 22 to 24, similarly, the plurality of bump members 40 may be arranged along the outer edge of the joining electrode 25a. Further, the plurality of bump members 40 may be arranged along the outer edge of the joining electrode 25a and a plurality or single bump member 40 may be arranged in a region surrounded by the plurality of bump members 40 (for example, see FIGS. 15, 17, or the like).

In the oven controlled crystal oscillator 400, the plurality of bump members 40 are provided in the joining part 22 of the integrated circuit device 20 and the the conducting pattern 25 has the circular (arc-shaped) joining electrode 25a in the plan view. Thereby, according to the oven controlled crystal oscillator 400, the spread of the conductive joining material 16 may be reduced by the plurality of bump members 40 like the second embodiment, and further, the spread of the conductive joining material 16 may be reduced by the outer edge of the joining electrode 25a like the third embodiment.

Furthermore, in the oven controlled crystal oscillator 400, the same advantages as those of the above described oven controlled crystal oscillator 100 may be obtained.

5. Fifth Embodiment

Figure 28:
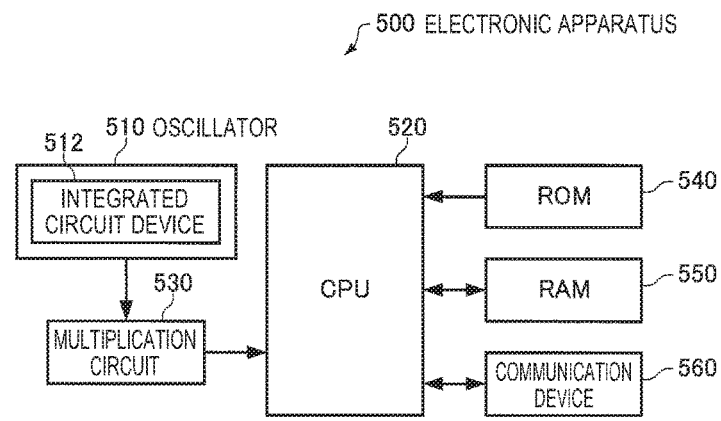
FIG. 28 is a functional block diagram showing an example of a configuration of an electronic apparatus of the fifth embodiment.

FIG. 28 is a functional block diagram showing an example of a configuration of an electronic apparatus according to the fifth embodiment. The electronic apparatus 500 according to the fifth embodiment includes an oscillator 510, a CPU (Central Processing Unit) 520, a multiplication circuit 530, a ROM (Read Only Memory) 540, a RAM (Random Access Memory) 550, and a communication device 560. Note that the electronic apparatus of the embodiment may have a configuration in which part of the component elements (respective parts) in FIG. 28 is omitted or changed or another component element is added.

The oscillator 510 outputs an oscillation signal at a desired frequency based on a signal from an oscillation source. The oscillator 510 includes an integrated circuit device 512 including a temperature sensor and a heat generation circuit for heating the vibrator. In the oscillator 510, the temperature of the vibrator is controlled to be constant using the integrated circuit device 512.

The multiplication circuit 530 multiplies and outputs the oscillation signal output by the oscillator 510 at a desired frequency. The oscillation signal output by the multiplication circuit 530 may be used as a clock signal of the CPU 520 or used by the CPU 520 for generating carrier wave for communication.

The CPU (processor) performs various kinds of calculation processing and control processing based on the oscillation signal output by the oscillator 510 or the oscillation signal output by the multiplication circuit 530 according to programs stored in the ROM 540 etc.

The ROM 540 stores programs, data, etc. for the CPU 520 to perform various kinds of calculation processing and control processing.

The RAM 550 is used as a work area of the CPU 520, and temporarily stores the programs and data read from the ROM 540, calculation results from execution by the CPU 520 according to various programs, etc.

The communication device 560 performs various kinds of control for establishment of data communication between the CPU 520 and an external apparatus.

For example, as the integrated circuit device 512, the integrated circuit device 20 that may improve productivity of wire bonding in the above described embodiments or respective modified examples is applied or, as the oscillator 510, the oven controlled crystal oscillators 100, 200, 300, 400 of the above described embodiments and respective modified examples are applied, and thereby, the electronic apparatus 500 with higher productivity may be realized.

Various electronic apparatuses are conceivable as the above described electronic apparatus 500, including e.g. GPS (Global Positioning System) modules, network apparatuses, broadcasting apparatuses, communication apparatuses used in artificial satellites and base stations, personal computers (e.g. mobile personal computers, laptop personal computers, tablet personal computers), moving object terminals such as smartphones and cell phones, digital cameras, inkjet ejection apparatuses (e.g. inkjet printers), storage area network apparatuses such as routers and switches, local area network apparatuses, moving object terminal base station apparatuses, televisions, video cameras, video recorders, car navigation apparatuses, real-time clock apparatuses, pagers, personal digital assistances (with or without communication function), electronic dictionaries, calculators, electronic game machines, game controllers, word processors, work stations, videophones, security television monitors, electronic binoculars, POS (Point of Sale) terminals, medical apparatuses (e.g., electronic thermometers, sphygmomanometers, blood glucose meters, electrocardiographic measurement apparatuses, ultrasonic diagnostic apparatuses, or electronic endoscopes), fish finders, various measuring instruments, meters and gauges (e.g., meters for vehicles, airplanes, and ships), flight simulators, head mounted displays, motion trace, motion tracking, motion controllers, PDR (pedestrian dead reckoning), etc.

As an example of the electronic apparatus 500 of the embodiment, a transmission apparatus that functions as e.g. a terminal base station apparatus making wired or wireless communications with terminals or the like using the oscillator 510 including the integrated circuit device 512 as a reference signal source may be taken. The integrated circuit device 20 in the above described embodiments or respective modified examples is applied as the integrated circuit device 512 or, the oven controlled crystal oscillators 100, 200, 300, 400 (including the integrated circuit devices 20) of the above described embodiments or respective modified examples are applied as the oscillator 510, and thereby, the electronic apparatus 500 available for a communication base station, for example, with desired higher frequency accuracy, higher performance, higher reliability than those of related art may be realized with higher productivity.

Further, as another example of the electronic apparatus 500 of the embodiment, a communication apparatus including the communication device 560 that receives an external clock signal and the CPU 520 (processor) having a frequency controller that controls the frequency of the oscillator 510 based on the external clock signal and the output signal of the oscillator 510 or the output signal (internal clock signal) of the multiplication circuit 530 may be taken. The communication apparatus may be e.g. a backbone network apparatus such as stratum 3 or a communication apparatus used for femtocell.

6. Sixth Embodiment

Figure 29:
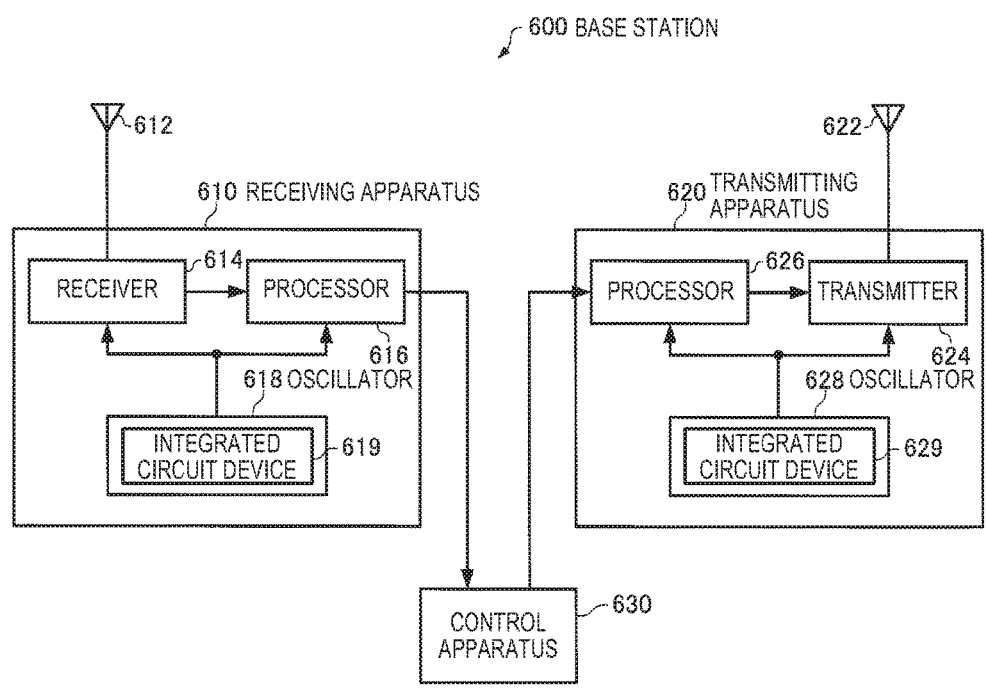
FIG. 29 shows an example of a schematic configuration of a base station according to the sixth embodiment.

FIG. 29 shows an example of a schematic configuration of a base station according to the sixth embodiment. The base station 600 according to the sixth embodiment includes a receiving apparatus 610, a transmitting apparatus 620, and a control apparatus 630. Note that the base station according to the embodiment may have a configuration in which part of the component elements (respective parts) in FIG. 29 is omitted or changed or another component element is added.

The receiving apparatus 610 includes a receiving antenna 612, a receiver 614, a processor 616, and an oscillator 618.

The oscillator 618 outputs an oscillation signal at a desired frequency based on a signal from an oscillation source. The oscillator 618 includes an integrated circuit device 619 including a temperature sensor and a heat generation circuit for heating the vibrator. In the oscillator 618, the temperature of the vibrator is controlled to be constant using the integrated circuit device 619.

The receiving antenna 612 receives radio wave with various kinds of information superimposed thereon from mobile stations (not shown) such as cell phones or GPS satellites.

The receiver 614 demodulates the signal received by the receiving antenna 612 to a signal in a desired intermediate frequency (IF) band using the oscillation signal output by the oscillator 618.

The processor 616 converts the signal in the intermediate frequency band demodulated by the receiver 614 into a baseband signal using the oscillation signal output by the oscillator 618 and demodulates the information contained in the baseband signal.

The control apparatus 630 receives the information demodulated by the receiving apparatus 610 (processor 616) and performs various kinds of processing according to the information. Then, the control apparatus 630 generates information to be transmitted to the mobile station and sends out the information to the transmitting apparatus 620 (processor 626).

The transmitting apparatus 620 includes a transmitting antenna 622, a transmitter 624, the processor 626, and an oscillator 628.

The oscillator 628 outputs an oscillation signal at a desired frequency based on a signal from an oscillation source. The oscillator 628 includes an integrated circuit device 629 including a temperature sensor and a heat generation circuit for heating the vibrator. In the oscillator 628, the temperature of the vibrator is controlled to be constant using the integrated circuit device 629.

The processor 626 generates a baseband signal using information received from the control apparatus 630 using the oscillation signal output by the oscillator 628 and converts the base band signal into a signal in an intermediate frequency band.

The transmitter 624 modulates and superimposes the signal in the intermediate frequency band from the processor 626 on the carrier wave using the oscillation signal output by the oscillator 628.

The transmitting antenna 622 transmits the carrier wave from the transmitter 624 as radio wave to mobile stations such as cell phones or GPS satellites.

As the integrated circuit device 619 of the receiving apparatus 610 and the integrated circuit device 629 of the transmitting apparatus 620, the integrated circuit device 20 that may improve productivity of wire bonding in the above described embodiments or respective modified examples is applied or, as the oscillator 618 of the receiving apparatus 610 and the oscillator 628 of the transmitting apparatus 620, the oven controlled crystal oscillators 100, 200, 300, 400 (including the integrated circuit devices 20) in the above described embodiments or respective modified examples are applied, and thereby, the base station with advantageous communication performance and higher reliability may be realized with higher productivity.

The invention is not limited to the embodiment and various modifications can be made within the scope of the invention.

For example, the oscillator of the above described embodiment is the oven controlled oscillator, however, the invention is not limited to the oven controlled oscillator. The invention may be applied to a temperature compensated oscillator (for example, TCXO (Temperature Compensated Crystal Oscillator)) having a temperature compensation function, a voltage controlled oscillator (for example, VCXO (Voltage Controlled Crystal Oscillator)) having a frequency control function, an oscillator having a temperature compensation function and a frequency control function (for example, VC-TCXO (Voltage Controlled Temperature Compensated Crystal Oscillator), or the like.

The above described embodiments and modified examples are just examples, and the invention is not limited to those. For example, the respective embodiments and the respective modified examples may be appropriately combined.

The invention includes substantially the same configurations (for example, the same configurations in function, method, and result or the same configurations in purpose and advantage) as the configurations explained in the embodiments. Further, the invention includes configurations in which non-essential parts of the configurations explained in the embodiments are replaced. Furthermore, the invention includes configurations that may exert the same effects or achieve the same purposes as those of the configurations explained in the embodiments. In addition, the invention includes configurations formed by adding known technologies to the configurations explained in the embodiments.

What is claimed is:

1. An integrated circuit device comprising:
   a substrate including a plurality of electrodes;
   a joining part provided on the substrate and joined to a vibrator; and
   a plurality of bonding pads provided on the substrate, each of the plurality of bonding pads being directly connected to a respective electrode of the plurality of electrodes,
   wherein the joining part comprises an insulating protective film that covers a part of a surface of the substrate, and
   no insulating protective film is provided between the adjacent bonding pads, such that a first gap is formed between each adjacent bonding pad where no insulating film provided, a second gap is formed between each adjacent electrode, and the first gap at least partially coincides with the second gap.

2. The integrated circuit device according to claim 1, further comprising:
   a heat generator that generates heat; and
   a temperature detector that detects an ambient temperature.

3. An electronic device comprising:
   a vibrator;
   a substrate including a plurality of electrodes;
   a joining part provided on the substrate and joined to the vibrator; and
   a plurality of bonding pads provided on the substrate, each of the plurality of bonding pads being directly connected to a respective electrode of the plurality of electrodes,
   wherein the joining part comprises an insulating protective film that covers a part of a surface of the substrate, and
   no insulating protective film is provided between the adjacent bonding pads, such that a first gap is formed between each adjacent bonding pad where no insulating film provided, a second gap is formed between each adjacent electrode, and the first gap at least partially coincides with the second gap.

4. The electronic device according to claim 3, wherein the joining part comprises:
   a plurality of bump members; and
   a conductive joining material at least partially surrounded by the plurality of bump members and joins the vibrator and the substrate.

5. The electronic device according to claim 4, wherein the plurality of bump members are provided separately from each other.

6. The electronic device according to claim 4, wherein the plurality of bump members are arranged in an arc form.

7. The electronic device according to claim 3, wherein the joining part includes a conducting pattern electrically connected to the vibrator, and the conducting pattern includes: a joining electrode having an oval shape and joined to the vibrator; and a lead electrode electrically connected to at least part of the plurality of bonding pads.

8. The electronic device according to claim 3, further comprising an oscillation circuit that controls vibration of the vibrator.

9. An electronic apparatus comprising the integrated circuit device according to claim 1.

10. A base station comprising the integrated circuit device according to claim 1.

* * * * *